(12) United States Patent
Sakuragi

(10) Patent No.: US 10,597,288 B2
(45) Date of Patent: Mar. 24, 2020

(54) MEMS-DEVICE MANUFACTURING METHOD, MEMS DEVICE, AND MEMS MODULE

(71) Applicant: ROHM CO., LTD., Kyoto (JP)

(72) Inventor: Masahiro Sakuragi, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 15/989,259

(22) Filed: May 25, 2018

(65) Prior Publication Data

US 2018/0346322 A1    Dec. 6, 2018

(30) Foreign Application Priority Data

May 30, 2017  (JP) ................. 2017-106121
Apr. 26, 2018  (JP) ................. 2018-085230

(51) Int. Cl.
*B81C 1/00* (2006.01)
*B81B 3/00* (2006.01)
*G01L 19/00* (2006.01)
*G01L 19/14* (2006.01)

(52) U.S. Cl.
CPC ........ *B81C 1/00047* (2013.01); *B81B 3/0021* (2013.01); *B81B 2201/0264* (2013.01); *B81B 2203/0127* (2013.01); *B81B 2203/0315* (2013.01); *B81B 2207/012* (2013.01); *B81C 2201/0116* (2013.01); *B81C 2201/053* (2013.01); *G01L 19/0069* (2013.01); *G01L 19/143* (2013.01)

(58) Field of Classification Search
CPC ......... B81C 1/00047; B81C 2201/0116; B81C 2201/053; B81B 3/0021; B81B 2201/0264; B81B 2207/012; B81B 2203/0315; B81B 2203/0127; G01L 19/143; G01L 19/0069
See application file for complete search history.

(56) References Cited

U.S. PATENT DOCUMENTS

| | | | |
|---|---|---|---|
| 2008/0261345 A1* | 10/2008 | Villa | G01L 9/0045 438/53 |
| 2009/0109262 A1* | 4/2009 | Cruz-Uribe | B41J 2/14233 347/68 |
| 2012/0118068 A1 | 5/2012 | Yamada et al. | |
| 2012/0211805 A1* | 8/2012 | Winkler | B81C 1/00246 257/254 |
| 2013/0130502 A1* | 5/2013 | Sparks | H01L 21/302 438/702 |
| 2014/0311249 A1 | 10/2014 | Yamada et al. | |
| 2016/0349129 A1* | 12/2016 | Pagani | G01L 9/0052 |

FOREIGN PATENT DOCUMENTS

JP    WO2011/010571 A1    12/2012

\* cited by examiner

*Primary Examiner* — Syed I Gheyas
(74) *Attorney, Agent, or Firm* — Rabin & Berdo, P.C.

(57) ABSTRACT

A method for manufacturing a MEMS device includes a hole forming step of forming a plurality of holes concaved from a principal surface in a substrate material including a semiconductor, a connecting-hollow-portion forming step of forming a connecting hollow portion that connects the plurality of holes together, and a movable-portion forming step of, by partially moving the semiconductor of the substrate material so as to close at least one part of the plurality of holes, forming a hollow portion that exists inside the substrate material and a movable portion that coincides with the hollow portion when viewed in a thickness direction of the substrate material.

9 Claims, 47 Drawing Sheets

FIG. 9
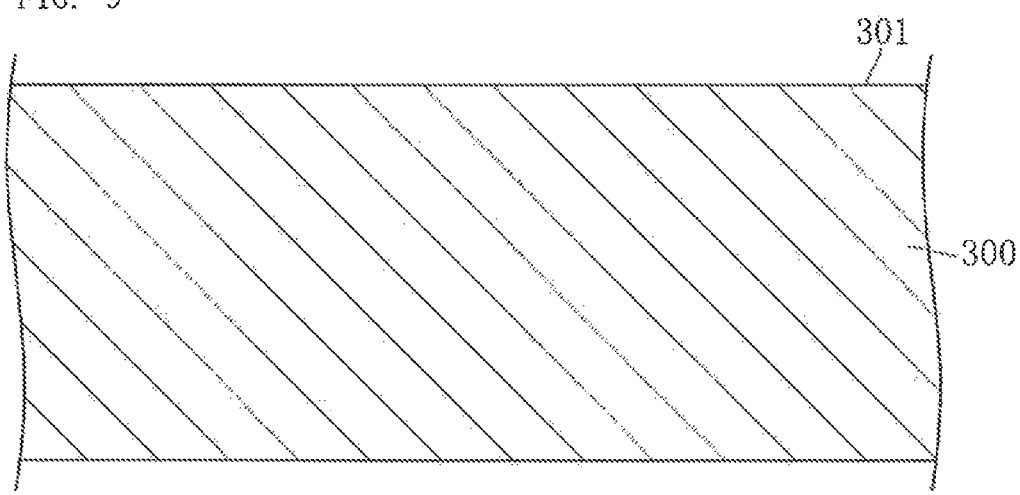
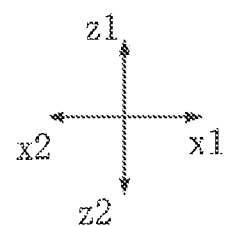

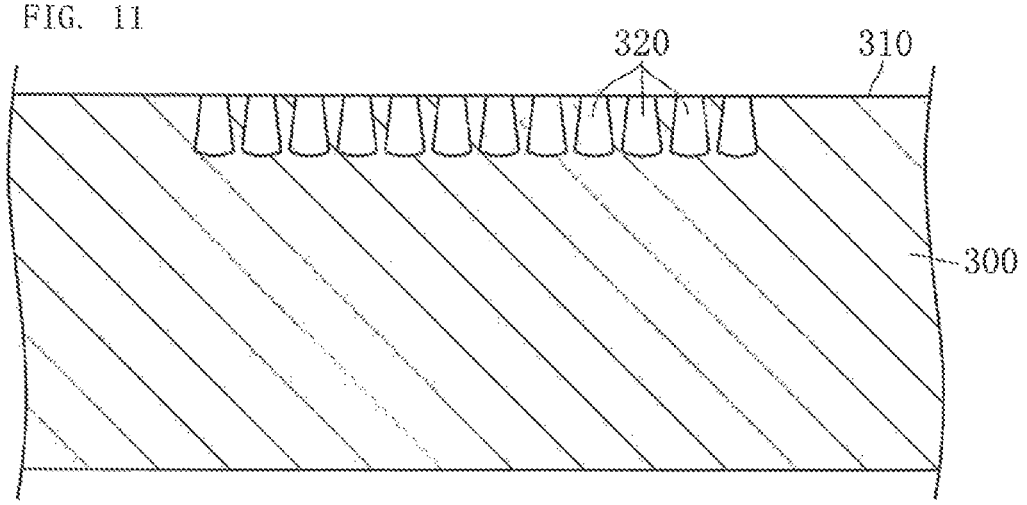
FIG. 11
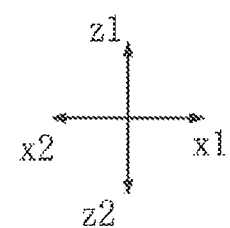

FIG. 12
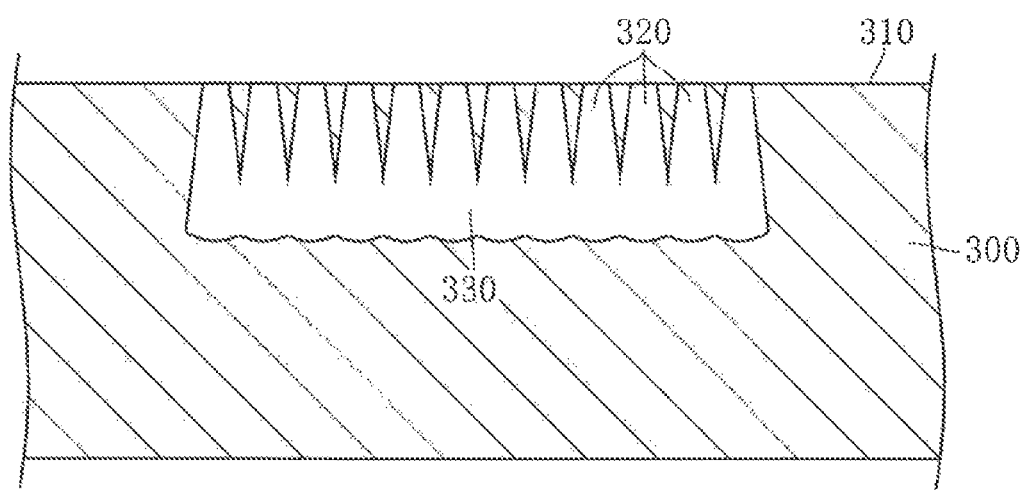
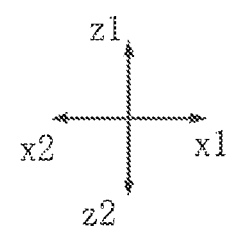

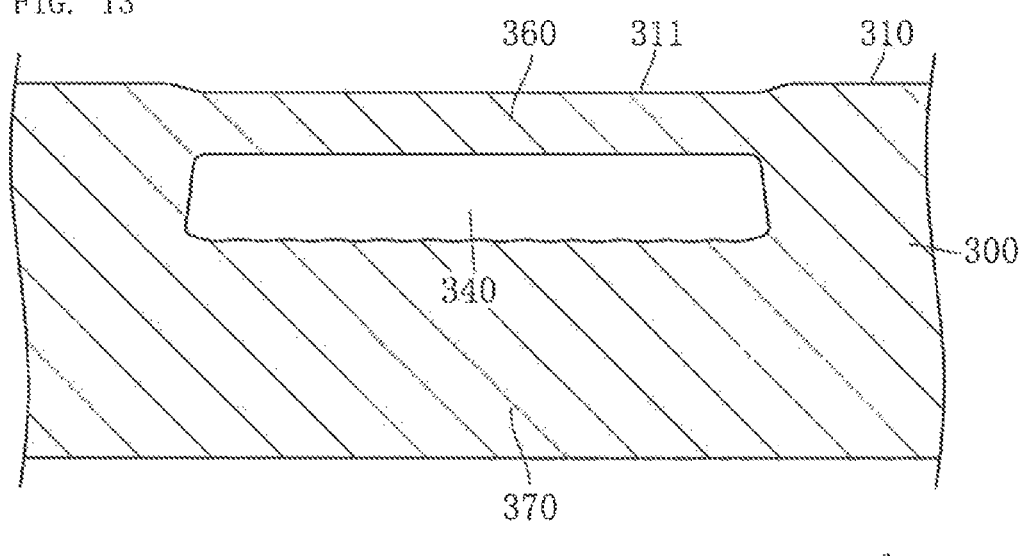
FIG. 13
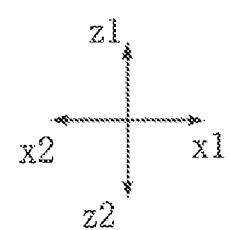

FIG. 17
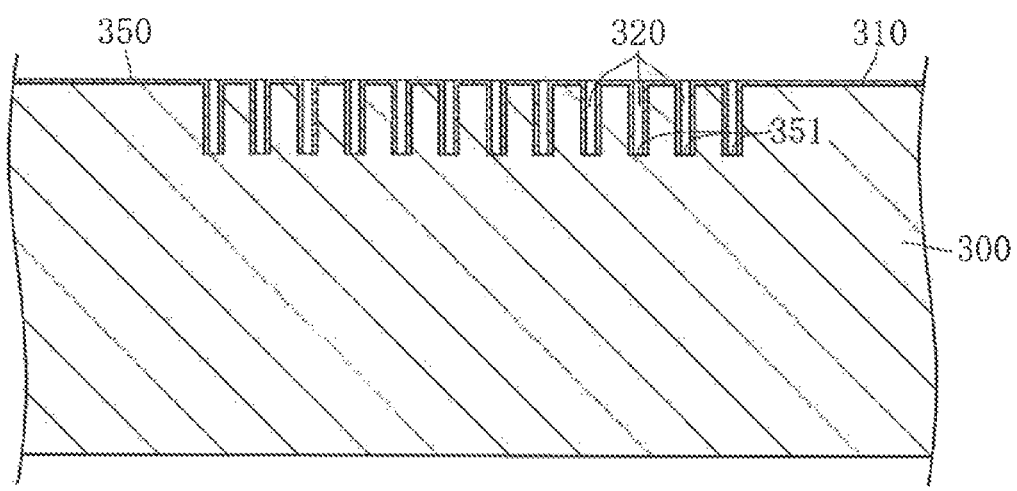
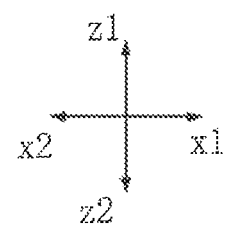

FIG. 18
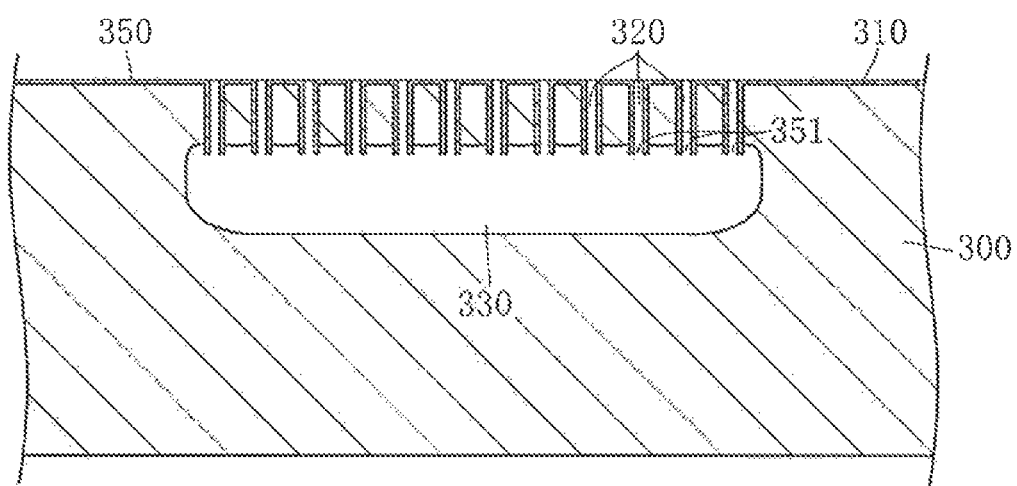
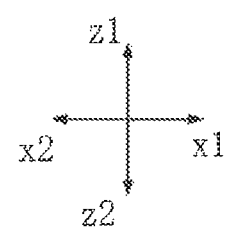

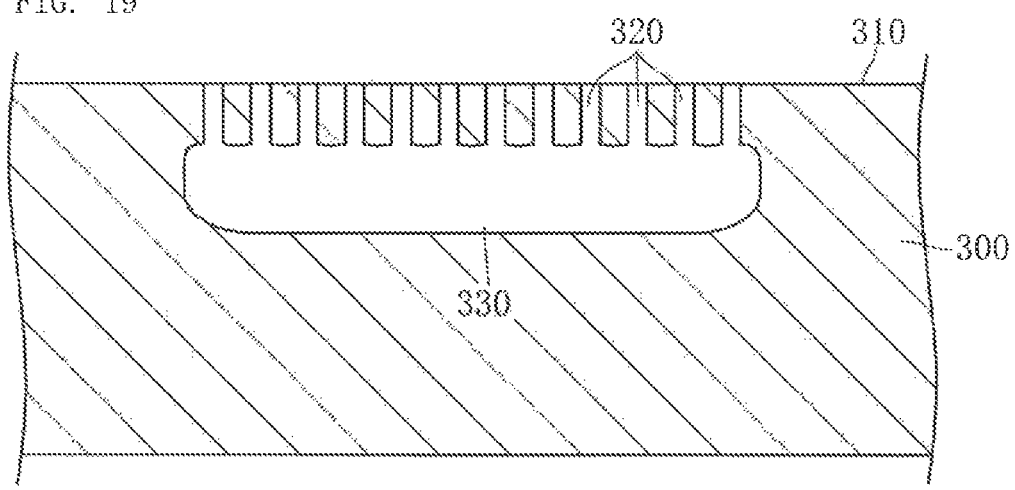
FIG. 19
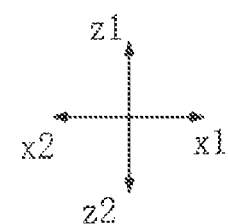

FIG. 27
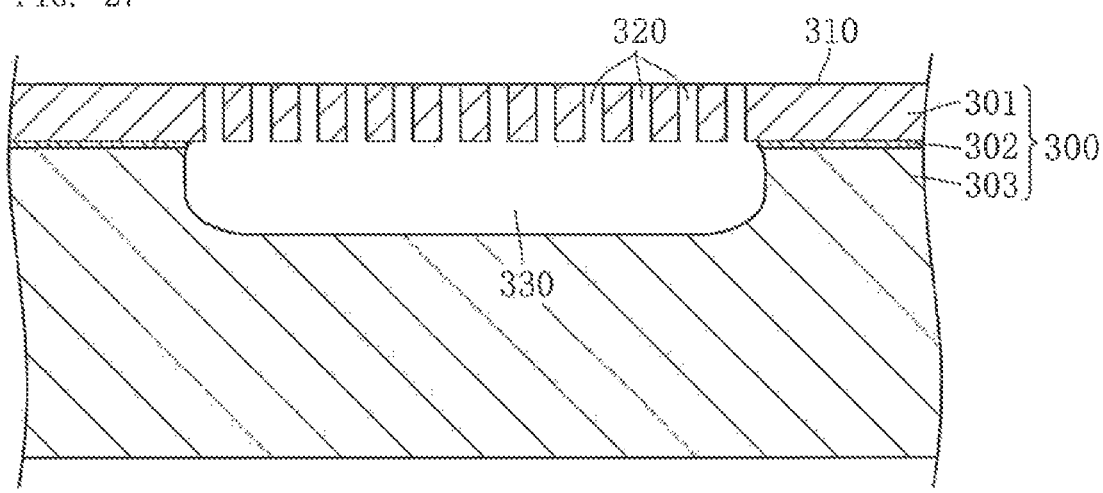
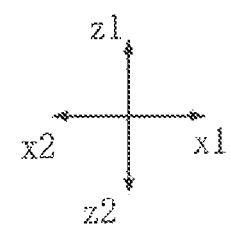

FIG. 31
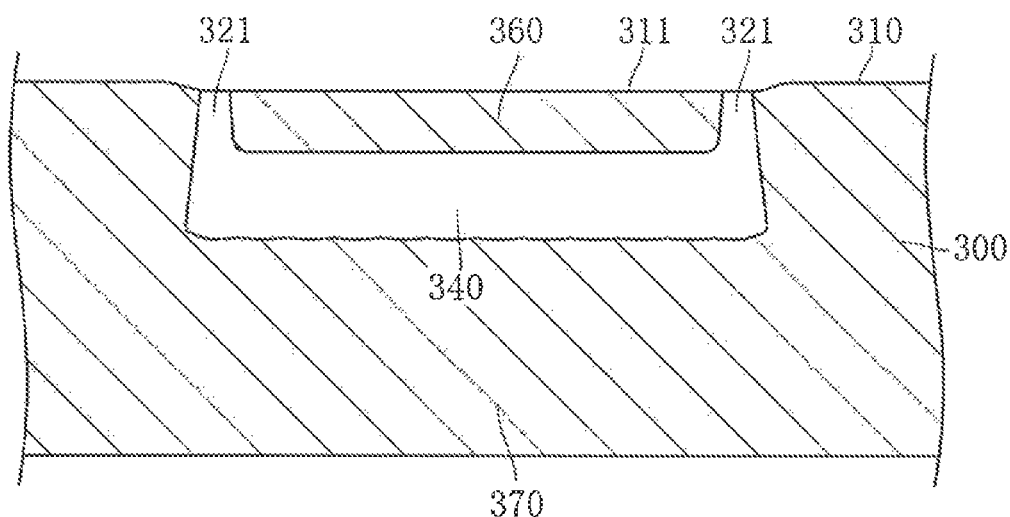
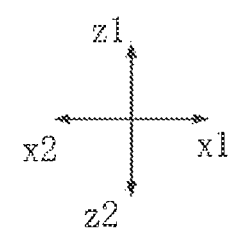

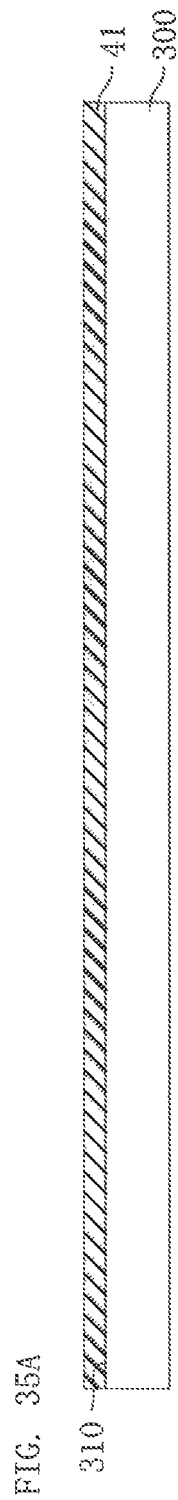

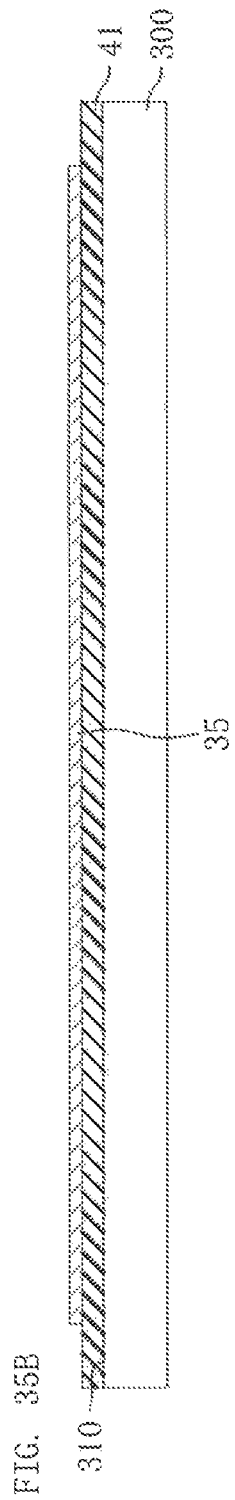

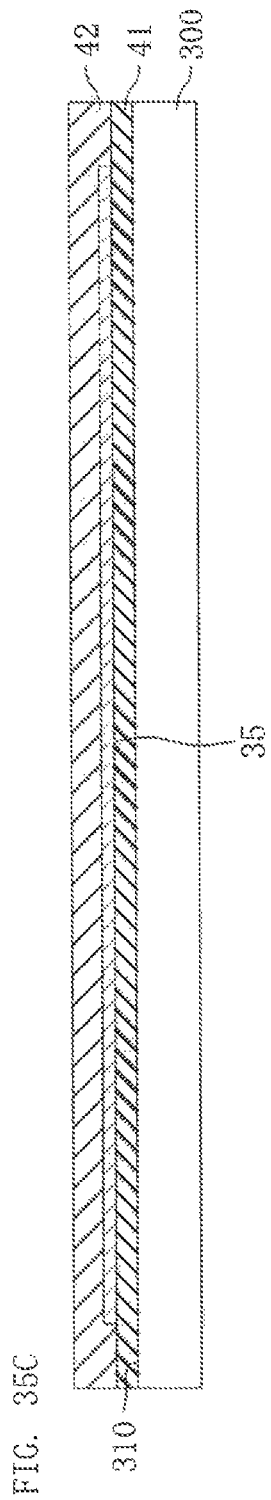

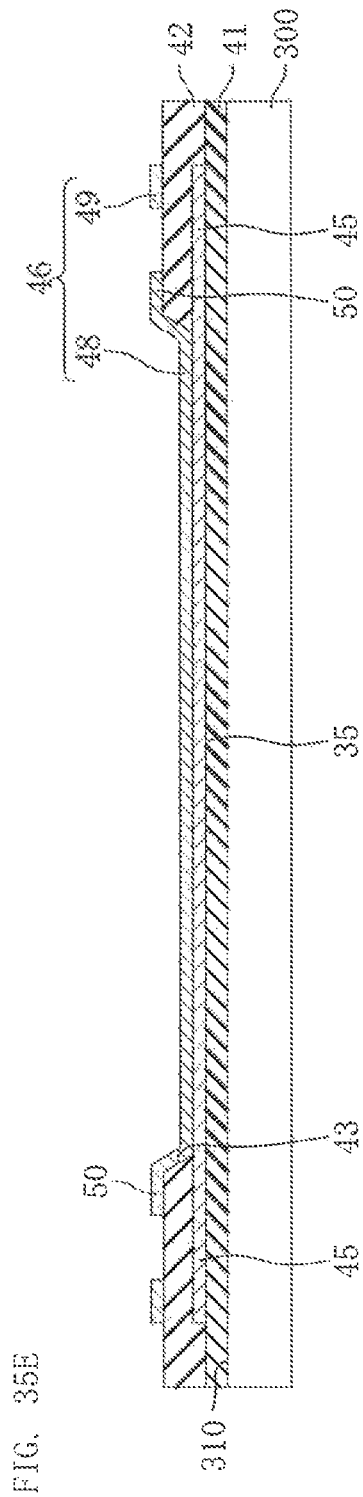

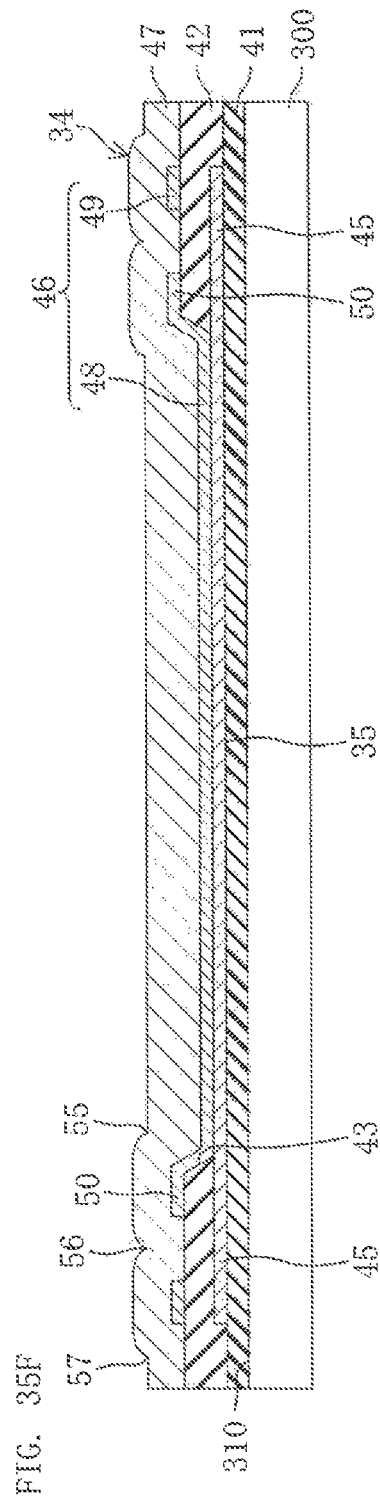

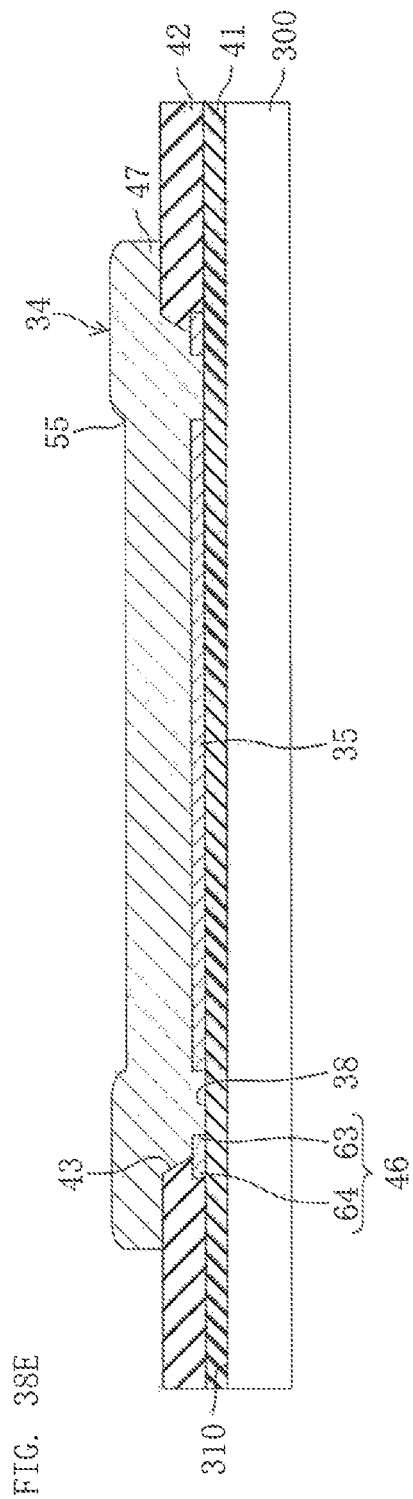

MEMS-DEVICE MANUFACTURING METHOD, MEMS DEVICE, AND MEMS MODULE

CROSS-REFERENCE TO RELATED APPLICATIONS

The present application corresponds to Japanese Patent Application No. 2017-106121 filed in the Japan Patent Office on May 30, 2017 and to Japanese Patent Application No. 2018-085230 filed in the Japan Patent Office on Apr. 26, 2018, and the entire disclosures of these applications are incorporated herein by reference.

Technical Field

The present invention relates to a method for manufacturing a MEMS device, relates to a MEMS device, and relates to a MEMS module.

Background Art

A MEMS (Micro Electro Mechanical System) device is known that is a device produced by integrating machine element components and electronic circuits together while employing a microfabrication technique for use in the production of semiconductor integrated circuits. Patent Document 1 (Domestic re-publication of PCT international application No. 2011-010571) describes a MEMS device that is an example of MEMS devices.

The MEMS device has a hollow portion and a movable portion with which the hollow portion is closed. In an arrangement disclosed by Patent Document 1, the hollow portion is formed by joining a glass substrate to a reverse side of a Si substrate at which a concave portion is formed. The joining operation is required to be performed so as not to generate microscopic gaps when the hollow portion is sealed up. Additionally, the Si substrate is required to be deeply dug in order to form the concave portion when the movable portion is finished as a comparatively thin part.

SUMMARY OF INVENTION

The present invention has been made in consideration of these circumstances, and aims to provide a method for manufacturing a MEMS device in which there is no need to perform a joining process for forming a hollow portion, and aims to provide a MEMS device, and aims to provide a MEMS module.

BRIEF DESCRIPTION OF DRAWINGS

FIG. 9 is a cross-sectional view of a principal portion showing a method for manufacturing the MEMS device according to the first preferred embodiment of the present invention.

FIG. 11 to FIG. 13 are cross-sectional views of a principal portion, each showing a method for manufacturing the MEMS device according to the first preferred embodiment of the present invention.

FIG. 15 to FIG. 20 are cross-sectional views of a principal portion, each showing a method for manufacturing a MEMS device according to a second preferred embodiment of the present invention.

FIG. 22 to FIG. 28 are cross-sectional views of a principal portion, each showing a method for manufacturing the MEMS device according to the third preferred embodiment of the present invention.

FIG. 30 and FIG. 31 are cross-sectional views of the principal portion, each showing a method for manufacturing the MEMS device according to the fourth preferred embodiment of the present invention.

FIG. 35A to FIG. 35F are diagrams shown to describe a process relative to the formation of the electrode pad.

FIG. 38A to FIG. 38E are diagrams shown to describe a process relative to the formation of the electrode pad.

DESCRIPTION OF EMBODIMENTS

Figure 1:
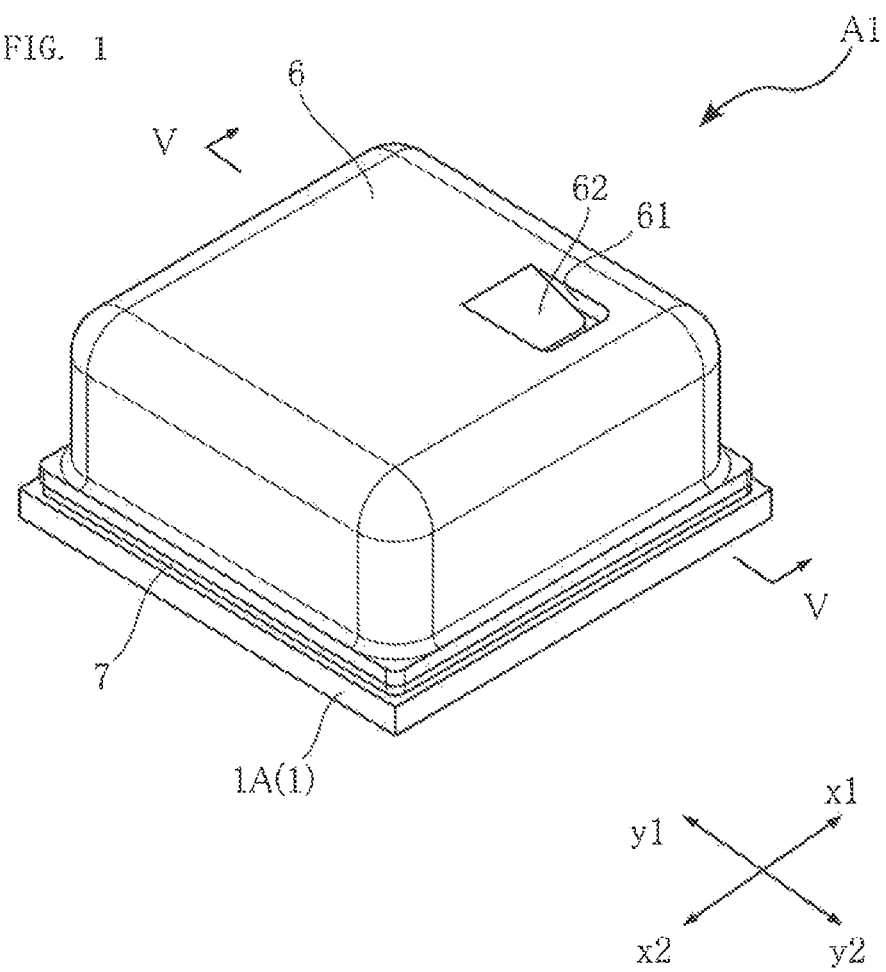
FIG. 1 is a perspective view showing a MEMS module according to a first preferred embodiment of the present invention.

A MEMS-device manufacturing method provided according to a first aspect of the present invention is characterized by including a hole forming step of forming a plurality of holes concaved from a principal surface in a substrate material including a semiconductor, a connecting-hollow-portion forming step of forming a connecting hollow portion that connects the plurality of holes together, and a movable-portion forming step of, by partially moving the semiconductor of the substrate material so as to close at least one part of the plurality of holes, forming a hollow portion that exists inside the substrate material and a movable portion that coincides with the hollow portion when viewed in a thickness direction of the substrate material.

In a preferred embodiment of the present invention, the semiconductor is Si.

In the preferred embodiment of the present invention, the semiconductor is partially moved by heating the substrate material in the movable-portion forming step.

In the preferred embodiment of the present invention, the hollow portion is brought into a sealed state by closing all of the plurality of holes in the movable-portion forming step.

In the preferred embodiment of the present invention, the MEMS device is configured as a MEMS device.

In the preferred embodiment of the present invention, the substrate material is made of only the semiconductor.

In the preferred embodiment of the present invention, the plurality of holes are formed by deep etching by which a cross-sectional area that is at a right angle to the thickness direction becomes larger in proportion to an approach to an innermost side in the thickness direction in the hole forming step, and the connecting hollow portion is formed by joining the holes that adjoin each other to each other while continuously performing the deep etching in the connecting-hollow-portion forming step.

In the preferred embodiment of the present invention, the MEMS-device manufacturing method further includes a protective-film forming step of forming a protective film with which the principal surface and inner side surfaces and bottom surfaces of the plurality of holes are covered and a through-hole forming step of forming a plurality of through-holes in the protective film by removing only a part of the protective film with which the bottom surfaces of the plurality of holes are covered, and both the protective-film forming step and the through-hole forming step are performed after the hole forming step and before the movable-portion forming step, and the connecting hollow portion is formed by performing etching through the plurality of through-holes of the protective film in the connecting-hollow-portion forming step.

In the preferred embodiment of the present invention, the MEMS-device manufacturing method further includes a protective-film removing step of removing all of the protective film, and the protective-film removing step is performed after the connecting-hollow-portion forming step and before the movable-portion forming step.

In the preferred embodiment of the present invention, the plurality of holes are formed so that a cross-sectional area that is at a right angle to the thickness direction becomes constant in the hole forming step.

In the preferred embodiment of the present invention, the substrate material has a first layer that is made of a semiconductor and that forms the principal surface, a third layer made of a semiconductor, and a second layer that is interposed between the first layer and the third layer and that is made of a material different from a semiconductor, and the plurality of holes that pass through the first layer and that use the second layer as each bottom surface of the plurality of holes are formed by use of the substrate material in the hole forming step, and the MEMS-device manufacturing method further includes a protective-film forming step of forming a protective film with which the principal surface and inner side surfaces and bottom surfaces of the plurality of holes are covered and a through-hole forming step of forming a plurality of through-holes that pass through the protective film and through the second layer by removing only a part of the protective film with which the bottom surfaces of the plurality of holes and a part of the second layer that forms the bottom surfaces are covered, and the protective-film forming step and the through-hole forming step are performed after the hole forming step and before the connecting-hollow-portion forming step, and the connecting hollow portion is formed by performing etching through the plurality of through-holes in the connecting-hollow-portion forming step.

In the preferred embodiment of the present invention, the first layer and the third layer are made of Si, and the second layer is made of $SiO_2$.

In the preferred embodiment of the present invention, the plurality of holes are formed so that a cross-sectional area that is at a right angle to the thickness direction becomes constant in the hole forming step.

A MEMS device provided according to a second aspect of the present invention is characterized in that the MEMS device includes a substrate that has a movable portion and a hollow portion that coincide with each other when viewed in a thickness direction and a fixed portion that supports the movable portion, and is characterized in that the movable portion and the fixed portion are made of a same and single semiconductor that does not have a joined portion at a boundary between the movable portion and the fixed portion.

In a preferred embodiment of the present invention, the semiconductor is Si.

In the preferred embodiment of the present invention, the substrate has a principal surface including a surface of the movable portion, and the principal surface has a concave portion that coincides with the movable portion when viewed in the thickness direction.

In the preferred embodiment of the present invention, the hollow portion has a side surface that stands up in the thickness direction, a bottom surface that spreads in a direction that intersects the side surface, and a curved surface that joins the side surface and the bottom surface together.

In the preferred embodiment of the present invention, the hollow portion is sealed up.

In the preferred embodiment of the present invention, the MEMS device is configured as a MEMS device.

A MEMS module provided according to a third aspect of the present invention is characterized by including the MEMS device provided according to the second aspect of the present invention and an electronic component that processes an electric signal emitted from the MEMS device.

According to the present invention, a joining process for forming a hollow portion is not required.

Other features and advantages of the present invention will be clarified by the detailed description given below with reference to the accompanying drawings.

Preferred embodiments of the present invention will be hereinafter described in detail with reference to the drawings.

A MEMS module A1 according to a first preferred embodiment of the present invention will be described with reference to FIG. 1 to FIG. 8. The MEMS module A1 is composed of a substrate 1, an electronic component 2, a MEMS device 3, a plurality of bonding wires 4, a cover 6, and a junction member 7. The MEMS module A1 of the present preferred embodiment is to detect atmospheric pressure, and is mounted on the surface of each circuit board of various electronic devices, such as portable terminals, etc. For example, in a portable terminal, the MEMS module A1 detects atmospheric pressure. The atmospheric pressure detected thereby is used as a piece of information for calculating a height. The purpose of use of the MEMS module according to the present invention is not limited to the detection of atmospheric pressure.

Figure 2:
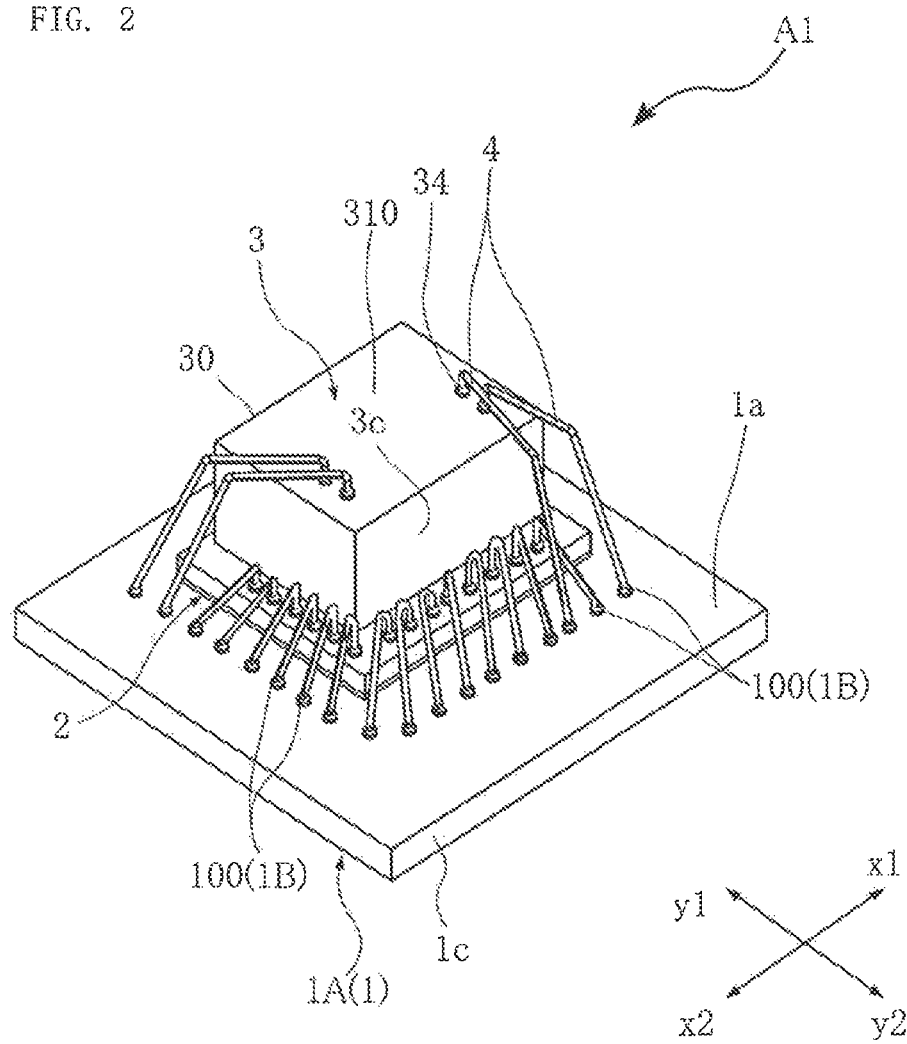
FIG. 2 is a perspective view of a principal portion showing the MEMS module according to the first preferred embodiment of the present invention.
Figure 3:
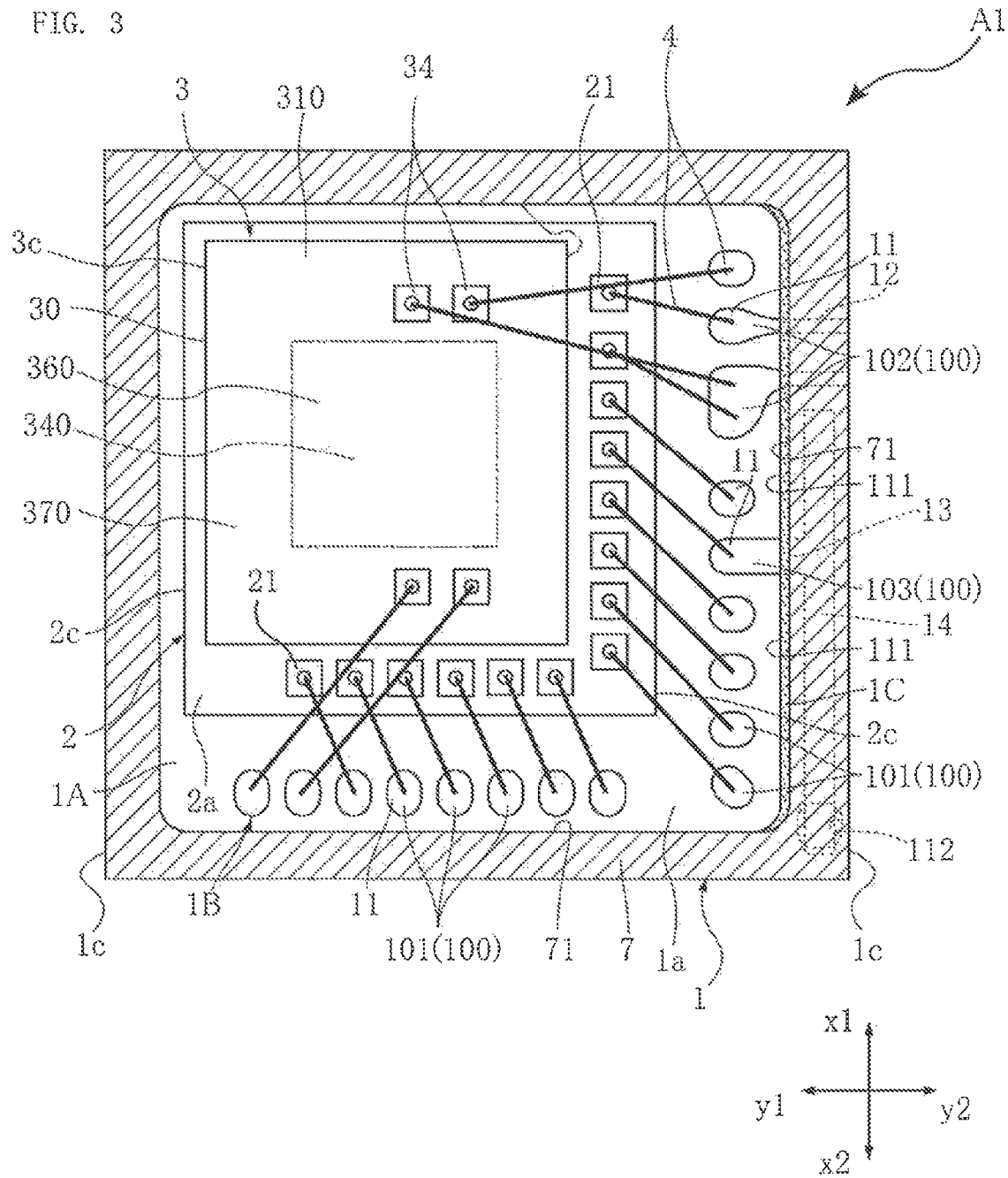
FIG. 3 is a plan view of a principal portion showing the MEMS module according to the first preferred embodiment of the present invention.
Figure 4:
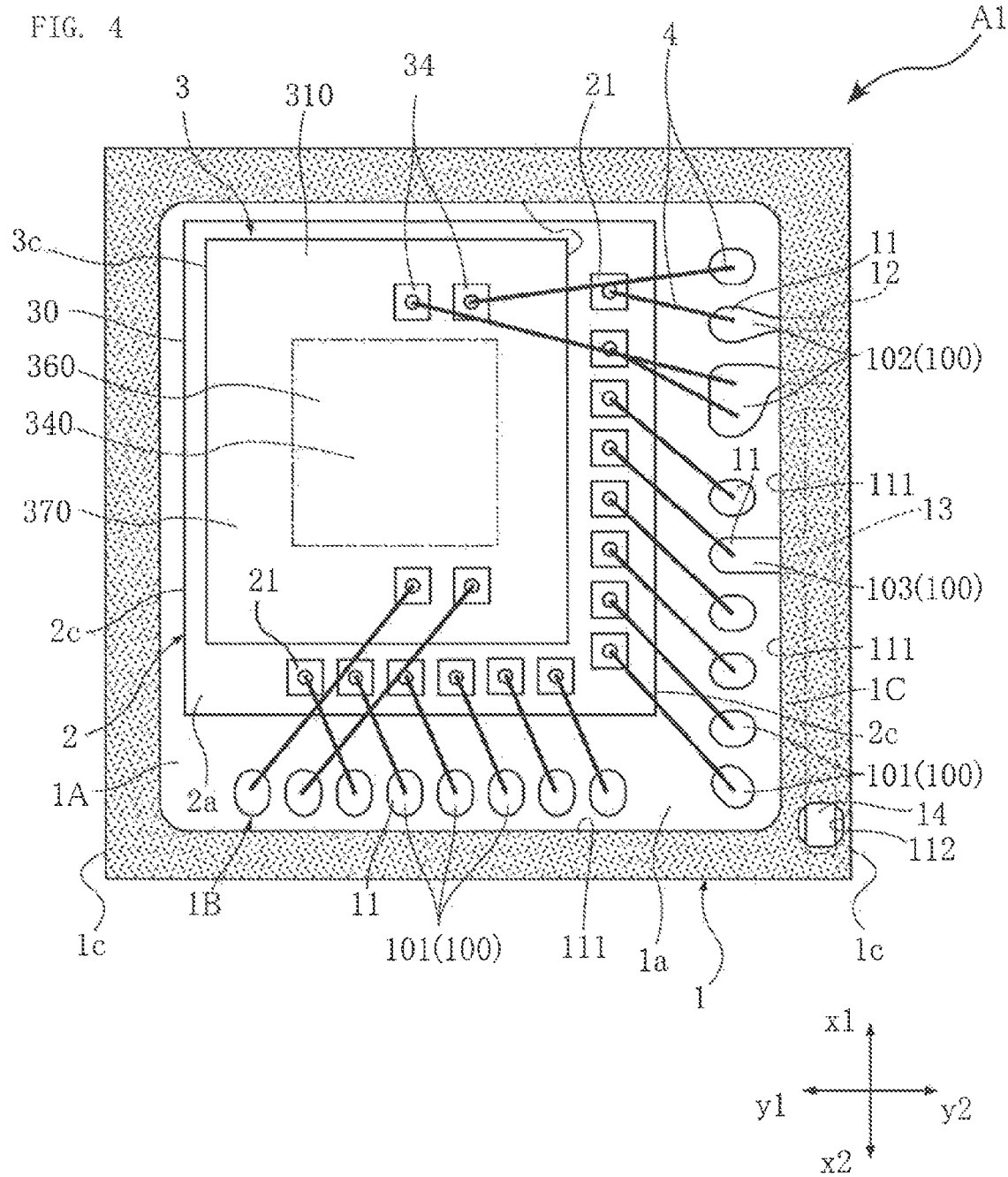
FIG. 4 is a plan view of the principal portion showing the MEMS module according to the first preferred embodiment of the present invention.
Figure 5:
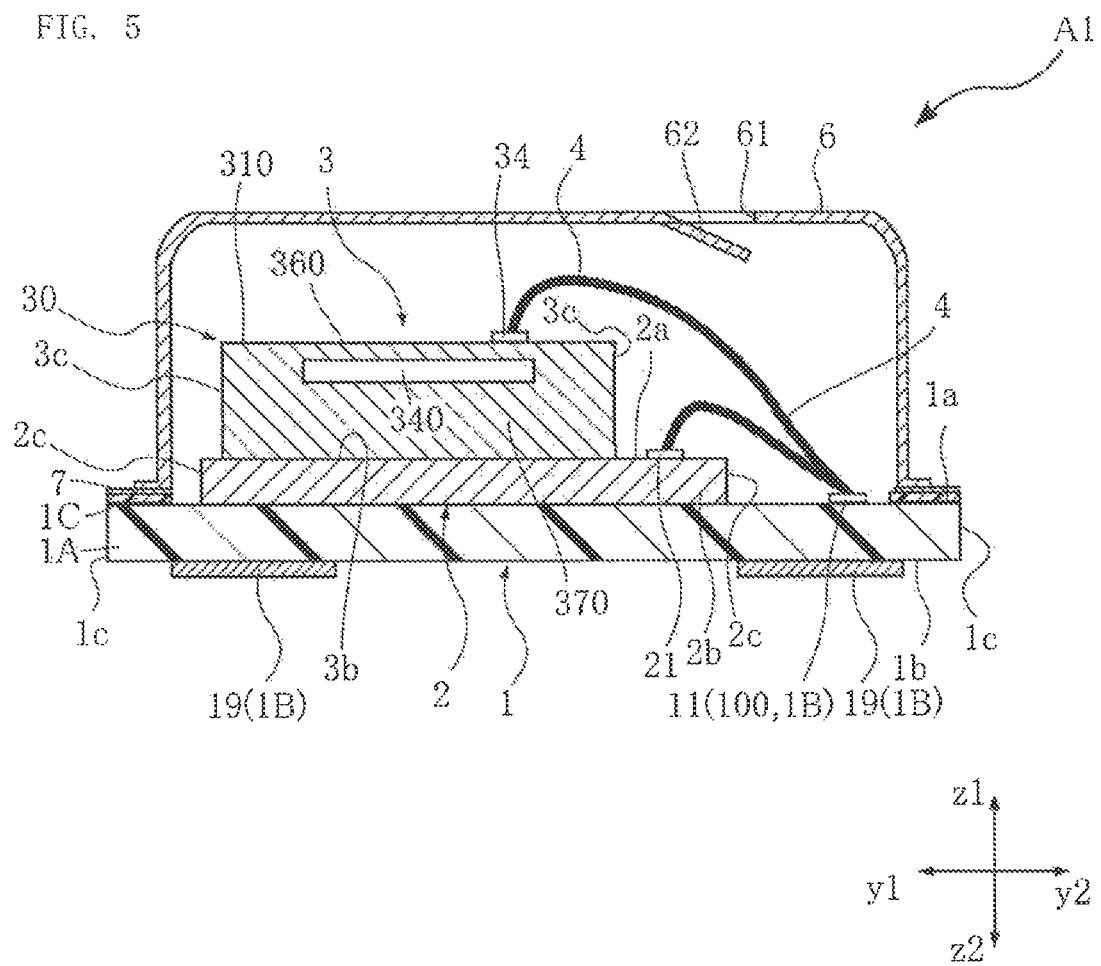
FIG. 5 is a cross-sectional view taken along line V-V of FIG. 1.
Figure 6:
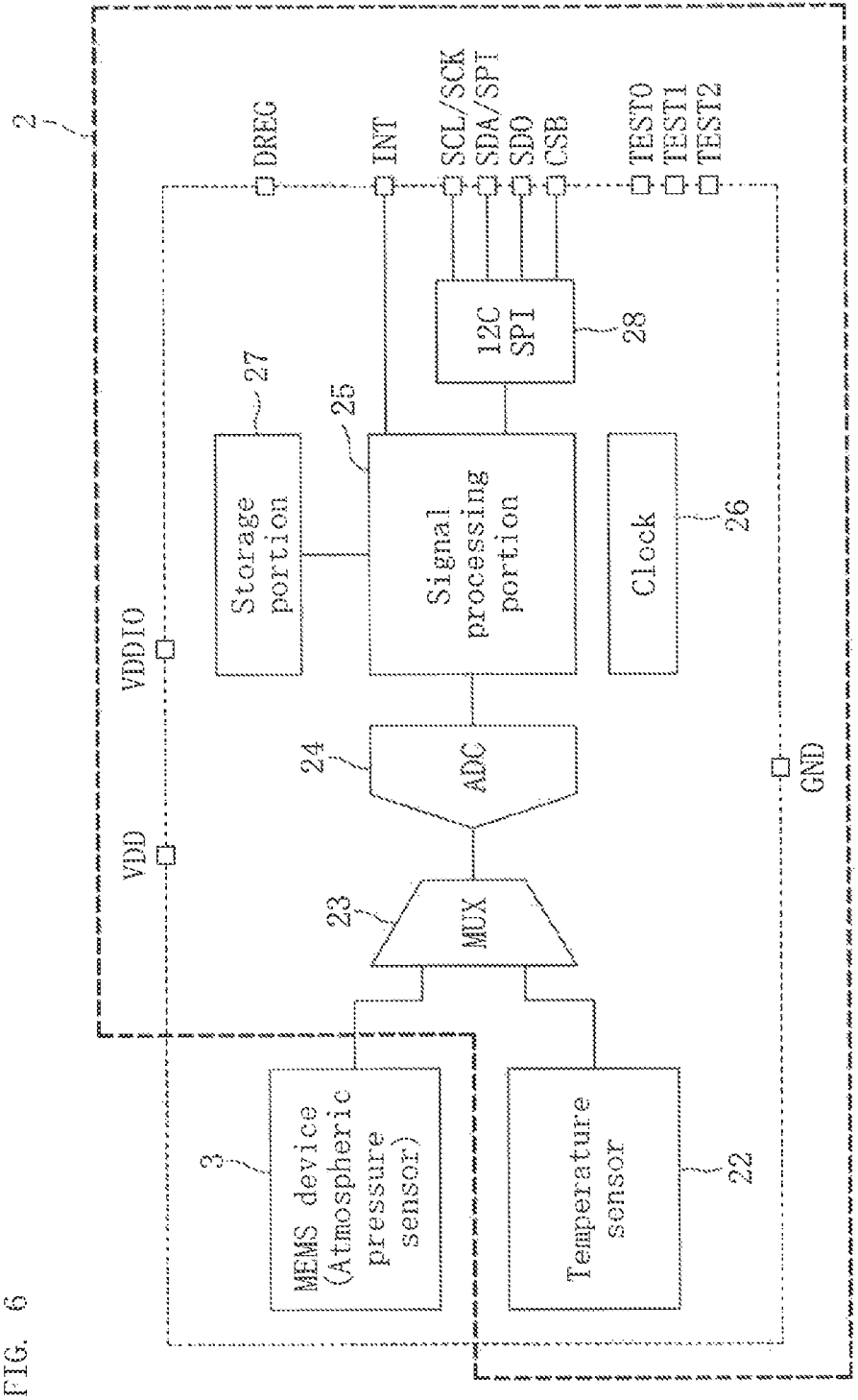
FIG. 6 is a block diagram of the MEMS module of FIG. 1.
Figure 7:
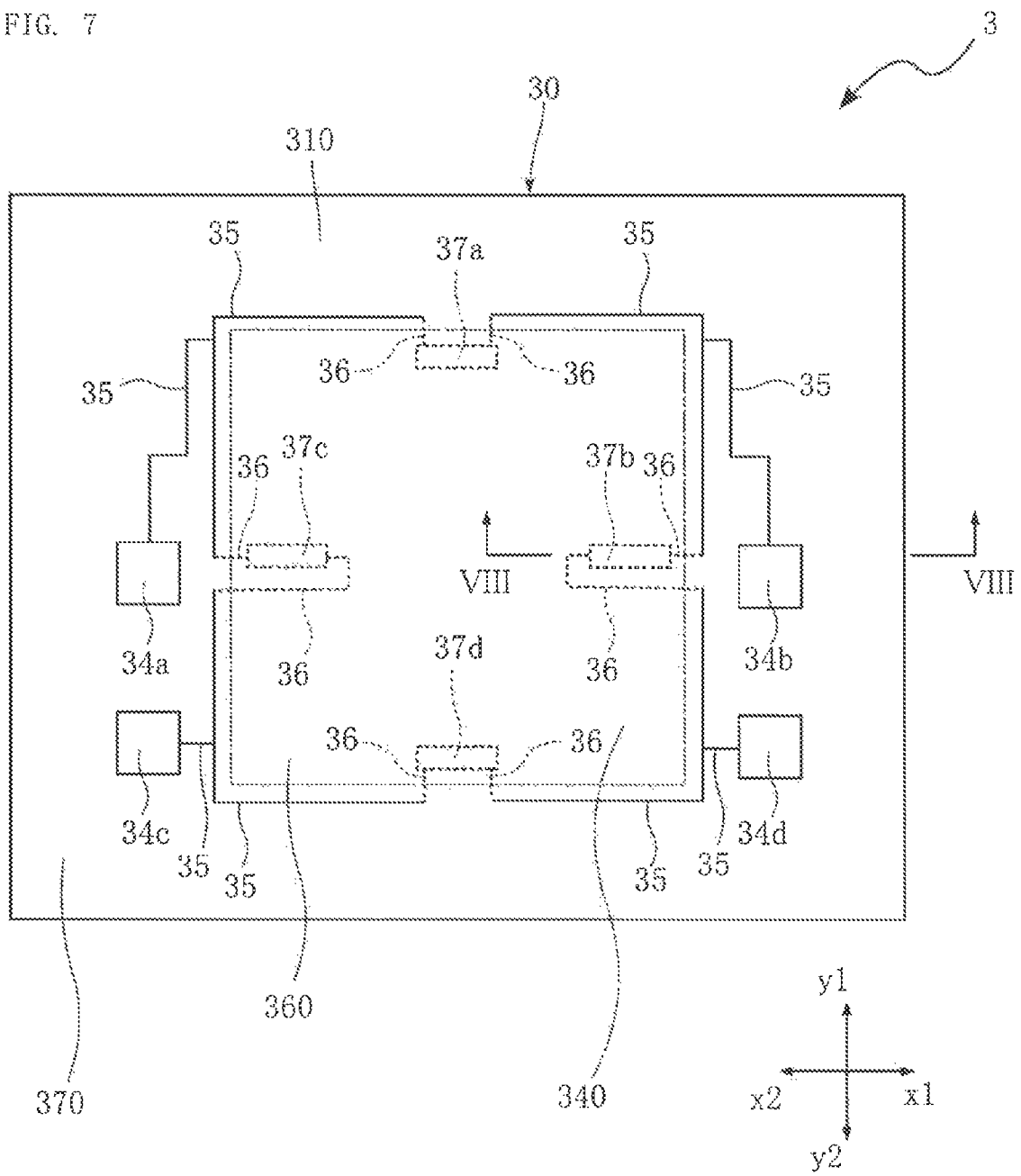
FIG. 7 is a plan view showing an example of a MEMS device of the MEMS module of FIG. 1.
Figure 8:
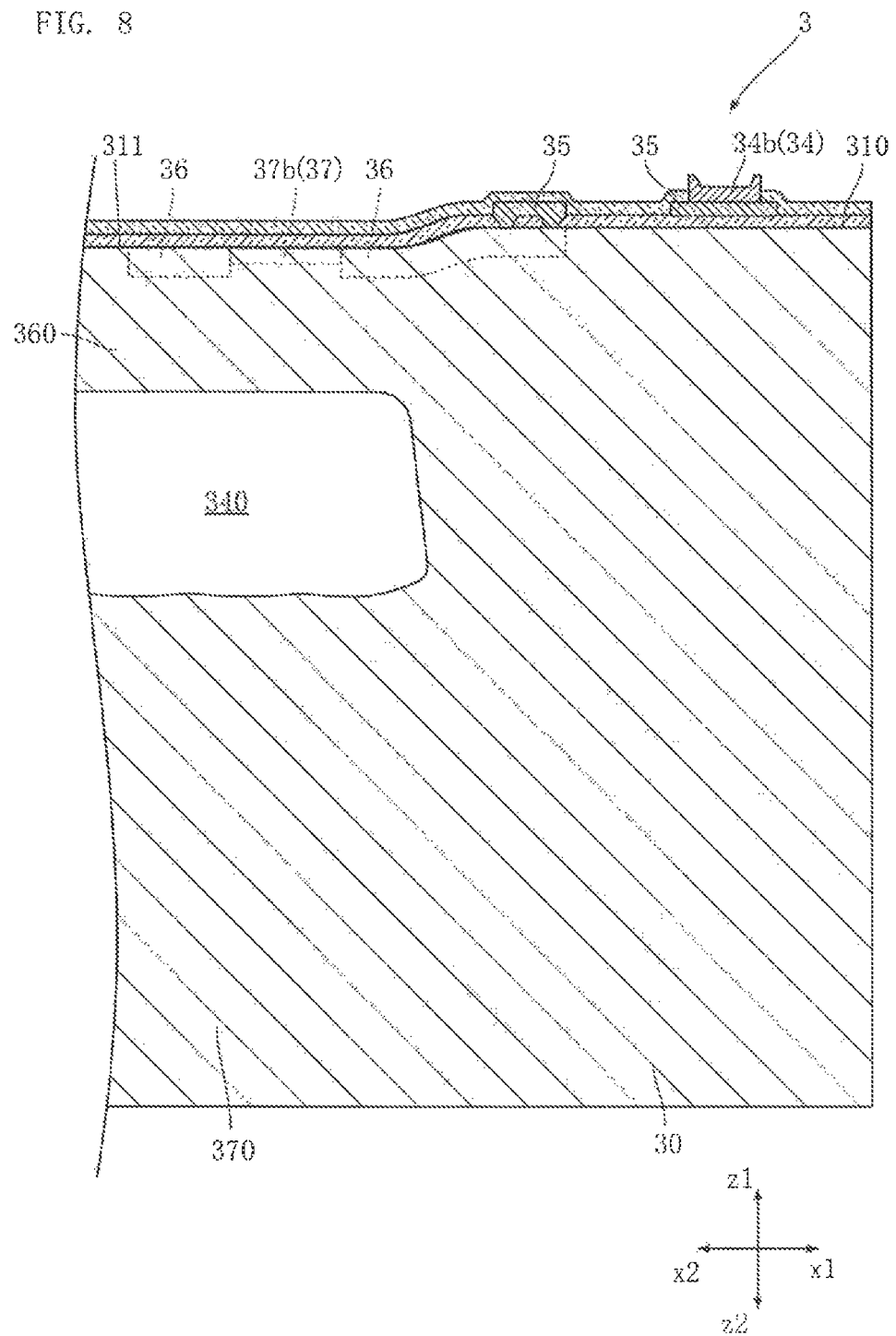
FIG. 8 is an enlarged cross-sectional view of a principal portion of the MEMS device taken along line VIII-VIII of FIG. 7.

FIG. 1 is a perspective view showing the MEMS module A1. FIG. 2 is a perspective view of a principal portion of the MEMS module A1 from which the cover 6, the junction member 7, and a wiring portion 1B and an insulating layer 1C, both of which will be described later, have been excluded. FIG. 3 is a plan view of the principal portion showing the MEMS module A1 from which the cover 6 has been excluded, and FIG. 4 is a plan view of the principal portion of the MEMS module A1 from which the junction member 7 has been further excluded. FIG. 5 is a cross-sectional view taken along line V-V of FIG. 1. FIG. 6 is a block diagram of the MEMS module A1. FIG. 7 is a plan view showing an example of the MEMS device 3 of the MEMS module A1. FIG. 8 is an enlarged cross-sectional view of a principal portion of the MEMS device 3 taken along line VIII-VIII of FIG. 7.

In these drawings, the thickness direction (direction in a plan view) of the MEMS module A1 will be described as a z direction (z1-z2 direction), and a direction along one side of the MEMS module A1 perpendicular to the z direction will be described as an x direction (x1-x2 direction), and a direction perpendicular to the z direction and to the x direction will be described as a y direction (y1-y2 direction) (the same applies to the other drawings described later). In the present preferred embodiment, the MEMS module A1 is, for example, about 2 mm in size in the x direction and in the y direction, and is, for example, about 0.8 mm to 1 mm in size in the z direction.

As shown in FIG. 1 to FIG. 5, the substrate 1 is a member on which the electronic component 2 is mounted and by which the MEMS module A1 is installed on circuit boards of various electronic devices. In the present preferred embodiment, the substrate 1 has a base 1A, a wiring portion 1B, and an insulating layer 1C. A concrete arrangement of the substrate 1 of the present invention is not limited to that of the present preferred embodiment, and is merely required to have the capability to appropriately support electronic devices, such as the electronic component 2 and the MEMS device 3, etc.

The base 1A is made of an electric insulator, and is a main structural member of the substrate 1. The base 1A is, for example, glass epoxy resin, polyimide resin, phenol resin, or ceramics, etc., and is not limited to these substances. The base 1A is formed, for example, in a rectangular plate shape in a plan view, and has a mounting surface 1a, an installing surface 1b, and a side surface 1c. The mounting surface 1a and the installing surface 1b face mutually-opposite sides in the thickness direction (z direction) of the substrate 1. The mounting surface 1a is a surface that follows a z1 direction and on which the electronic component 2 is mounted. The installing surface 1b is a surface that follows a z2 direction and that is used when the MEMS module A1 is installed on circuit boards of various electronic devices. The side surface 1c is a surface by which the mounting surface 1a and the installing surface 1b are joined together and that follows the x direction or the y direction and is parallel to the z direction. In the present preferred embodiment, the substrate 1 is about 100 to 200 μm in size in the z direction, and is about 2 mm in size in the x direction and in the y direction, respectively.

The wiring portion 1B serves as an electrically conductive path through which an electric current is conducted between the electronic component 2, the MEMS device 3, and circuits, etc., outside the MEMS module A1. The wiring portion 1B is made of a single kind of metal or a plurality of kinds of metals, such as Cu, Ni, Ti, and Au, etc., and is formed by, for example, plating. In the present preferred embodiment, the wiring portion 1B has a plurality of mounting surface portions 100 and rear-surface pads 19, and yet this is an example of a concrete arrangement of the wiring portion 1B, and specific limitations are not imposed on its concrete arrangement.

As shown in FIG. 3 and FIG. 4, the plurality of mounting surface portions 100 are formed on the mounting surface 1a of the base 1A, and are independent regions that are separated from each other. In the present preferred embodiment, the mounting surface portions 100 include a plurality of first mounting surface portions 101, second mounting surface portions 102, and a third mounting surface portion 103.

As shown in FIG. 3 and FIG. 4, the first mounting surface portion 101 consists only of an electrode pad 11, and is formed in, for example, an elliptical shape or a rectangular shape, etc., as in the drawings. The electrode pad 11 is an element to which an end of the bonding wire 4 is bonded. In the present preferred embodiment, the plurality of first mounting surface portions 101 are disposed along the y direction. Additionally, the plurality of first mounting surface portions 101 are disposed along the x direction together with the second mounting surface portions 102 and the third mounting surface portion 103.

As shown in FIG. 3 and FIG. 4, the second mounting surface portion 102 has the electrode pad 11 and an extension portion 12. The electrode pad 11 is an element to which an end of the bonding wire 4 is bonded as mentioned above. The extension portion 12 extends from the electrode pad 11, and reaches an outer end edge of the base 1A. In the present preferred embodiment, the two second mounting surface portions 102 are disposed along the x direction. The extension portion 12 extends along the y direction. The extension portion 12 is the remainder of a part that has served as an electrically conductive path for forming a conductive film that is to be used as the wiring portion 1B by means of electrolytic plating, for example, when a plurality of substrates 1 are formed in one operation by use of a substrate material in the manufacturing method of the MEMS module A1.

As shown in FIG. 3 and FIG. 4, the third mounting surface portion 103 has the electrode pad 11, a connection portion 13, and a branch portion 14. The electrode pad 11 is an element to which an end of the bonding wire 4 is bonded as mentioned above. The connection portion 13 extends outwardly from the electrode pad 11. The branch portion 14 is joined to the connection portion 13, and extends in a direction differing from that of the connection portion 13. In the present preferred embodiment, the connection portion 13 extends from the electrode pad 11 in the y2 direction. The branch portion 14 extends from an end in the y2 direction of the connection portion 13 along the x direction. In the examples shown in the drawings, the branch portion 14 extends from the end in the y2 direction of the connection portion 13 both in the x1 direction and in the x2 direction. The branch portion 14 is set to have such a length as to overlap with the plurality of first mounting surface portions 101 arranged in the x direction when viewed in the y direction. The branch portion 14 extends along the outer end edge of the base 1A, and is separated from the outer end edge of the base 1A in the y1 direction.

A rear-surface pad 19 is disposed on the installing surface 1b, and is used as an electrode to be electrically joined when the MEMS module A1 is installed on a circuit board or the like. The rear-surface pad 19 is electrically connected to an appropriate place of the mounting surface portion 100.

The insulating layer 1C serves to insulate and protect an appropriate place of the wiring portion 1B by covering its appropriate place therewith. The insulating layer 1C is made of an insulating material, such as a resist resin. In the present preferred embodiment, the insulating layer 1C is formed in a rectangular and annular shape in a plan view as shown in FIG. 3 and FIG. 4.

The insulating layer 1C has an insulating-layer inner end edge 111 and an opening 112. The insulating-layer inner end edge 111 is an inner end edge of the insulating layer 1C formed in a rectangular and annular shape, and surrounds the electronic component 2 and the MEMS device 3. The opening 112 is a through-hole, and overlaps with a part of the branch portion 14 of the third mounting surface portion 103 in a plan view. In the examples shown in the drawings, an outer end edge of the insulating layer 1C coincides with the outer end edge of the base 1A.

The junction member 7 is to join the substrate 1 and the cover 6 together, and is made of, for example, a paste joining material that includes a metal, such as Ag, etc. In the present preferred embodiment, the junction member 7 is disposed so as to have a rectangular and annular shape in a plan view, and the entirety of the junction member 7 is formed in a region that coincides with the insulating layer 1C. The junction member 7 has a junction-member inner end edge 71. The junction-member inner end edge 71 is an inner end edge of the junction member 7 formed in a rectangular and annular shape. In the examples shown in the drawings, an outer end edge of the junction member 7 roughly coincides with the outer end edge of the insulating layer 1C and that of the base 1A, and yet may deviate from the outer end edge of the insulating layer 1C and from that of the base 1A.

As shown in FIG. 3 and FIG. 4, the first mounting surface portion 101 consisting only of the electrode pad 11 is separated inwardly from the insulating-layer inner end edge 111 of the insulating layer 1C and from the junction-member inner end edge 71 of the junction member 7 in a plan view. Additionally, in a part of the insulating layer 1C and a part of the junction member 7 each of which faces the first mounting surface portion 101, the insulating-layer inner end edge 111 and the junction-member inner end edge 71 coincide with each other in a plan view.

As shown in FIG. 3 and FIG. 4, in the second mounting surface portion 102 that has the electrode pad 11 and the extension portion 12, the electrode pad 11 is separated inwardly from the insulating-layer inner end edge 111 of the insulating layer 1C and from the junction-member inner end edge 71 of the junction member 7 in a plan view, and at least one part of the extension portion 12 is covered with the insulating layer 1C and with the junction member 7. Additionally, in a part of the insulating layer 1C and a part of the junction member 7 each of which faces the second mounting surface portion 102, the insulating-layer inner end edge 111 is placed at a more inward position on the second-mounting-surface-portion-102 side than the junction-member inner end edge 71 in a plan view.

As shown in FIG. 3 and FIG. 4, in the third mounting surface portion 103 that has the electrode pad 11, the connection portion 13, and the branch portion 14, the electrode pad 11 is separated inwardly from the insulating-layer inner end edge 111 of the insulating layer 1C and from the junction-member inner end edge 71 of the junction member 7 in a plan view. On the other hand, at least one part of the connection portion 13 and at least one part of the branch portion 14 are covered with the insulating layer 1C and with the junction member 7. In the examples shown in the drawings, a part of the connection portion 13 is covered with the insulating layer 1C and with the junction member 7, and the entirety of the branch portion 14 is covered with the insulating layer 1C and with the junction member 7. Additionally, in a part of the insulating layer 1C and a part of the junction member 7 each of which faces the third mounting surface portion 103, the insulating-layer inner end edge 111 is placed at a more inward position on the third-mounting-surface-portion-103 side than the junction-member inner end edge 71 in a plan view.

Additionally, the opening 112 of the insulating layer 1C overlaps with a part of the branch portion 14 in a plan view, and therefore the branch portion 14 and the junction member 7 are contiguous to each other through the opening 112. In other words, the third mounting surface portion 103 and the junction member 7 are electrically connected to each other.

The electronic component 2 processes an electric signal detected by a sensor, and is configured as a so-called ASIC (Application Specific Integrated Circuit) element. In the present preferred embodiment, the electronic component 2 includes a temperature sensor 22, and processes an electric signal detected by the temperature sensor 22 and an electric signal detected by the MEMS device 3 as shown in FIG. 12. The electronic component 2 multiplexes the electric signal detected by the temperature sensor 22 and the electric signal detected by the MEMS device 3 by means of a multiplexer 23, and converts a resulting signal into a digital signal by means of an analog/digital conversion circuit 24. Thereafter, based on a clock signal of a clock 26, a signal processing portion 25 performs processing, such as amplification, filtering, and logical operations, etc., while using a storage area of a storage portion 27. A signal that has undergone signal processing is output through an interface 28. This enables the MEMS module A1 to apply appropriate signal processing to a signal obtained by detecting atmospheric pressure and temperature and to output the resulting signal.

The electronic component 2 is used to control various devices installed and packaged on the substrate. The electronic component 2 is formed in a rectangular plate shape in a plan view, and has a mounting surface 2a, an installing surface 2b, and a side surface 2c. The mounting surface 2a and the installing surface 2b face mutually-opposite sides in the thickness direction (z direction) of the electronic component 2. The mounting surface 2a is a surface that follows the z1 direction and on which the MEMS device 3 is mounted. The installing surface 2b is a surface that follows the z2 direction and that is used when the electronic component 2 is installed on the mounting surface 1a of the substrate 1. The side surface 2c is a surface by which the mounting surface 2a and the installing surface 2b are joined together and that follows the x direction or the y direction and is parallel to the z direction. In the present preferred embodiment, the electronic component 2 is about 80 μm in size in the z direction, and is about 1 to 1.2 mm in size in the x direction and in the y direction, respectively.

The electronic component 2 is mounted closer to the x1 direction and the y1 direction of the mounting surface 1a of the substrate 1. The electronic component 2 and the substrate 1 are joined together by means of a die attach film (not shown) or the like.

A plurality of electrode pads 21 are disposed on the mounting surface 2a of the electronic component 2. The electrode pad 21 is used as an electrode that is electrically joined to the electrode pad 11 of the substrate 1. The bonding wire 4 is bonded to the electrode pad 21. The electrode pad 21 is made of a metal, such as Al or an aluminum alloy, etc., and is formed by, for example, plating. The electrode pad 21 is connected to a wiring pattern of the mounting surface 2a, and is disposed so as to surround a region in which the MEMS device 3 is mounted.

The MEMS device 3 is a MEMS device according to the first preferred embodiment of the present invention. No specific limitations are imposed on the function of the MEMS device according to the present invention, and, in the present preferred embodiment, the MEMS device 3 is configured as an atmospheric pressure sensor that detects atmospheric pressure. The MEMS device 3 detects atmospheric pressure, and outputs a detection result to the electronic component 2 in the form of an electric signal. As shown in FIG. 5, FIG. 7, and FIG. 8, the MEMS device 3 is formed in a cubic shape, and includes a substrate 30 that has a principal surface 310, an installing surface 3b, and a side surface 3c. The principal surface 310 and the installing surface 3b face mutually-opposite sides in the thickness direction (z direction) of the MEMS device 3. The principal surface 310 is a surface that follows the z1 direction. The installing surface 3b is a surface that follows the z2 direction and that is used when the MEMS device 3 is installed on the electronic component 2. The side surface 3c is a surface by which the principal surface 310 and the installing surface 3b are joined together and that follows the x direction or they direction and is parallel to the z direction. In the present preferred embodiment, the MEMS device 3 is about 200 to 300 μm in size in the z direction, and is about 0.7 to 1.0 mm in size in the x direction and in the y direction.

The substrate 30 is made of a semiconductor, and, in the present preferred embodiment, is made of Si. The substrate 30 has a hollow portion 340, a movable portion 360, and a fixed portion 370. The hollow portion 340 is a cavity defined in the substrate 30, and, in the present preferred embodiment, is sealed up. In the present preferred embodiment, the hollow portion 340 is brought into a vacuum state closer to an absolute vacuum. Additionally, in the present preferred embodiment, the hollow portion 340 is rectangular when viewed in the z direction. The hollow portion 340 is, for example, 5 μm to 10 μm in size in the z direction, respectively.

The movable portion 360 is a part that overlaps with the hollow portion 340 when viewed in the z direction, and is movable in the z direction in order to detect atmospheric pressure. In the present preferred embodiment, the movable portion 360 is rectangular when viewed in the z direction. The thickness of the movable portion 360 is, for example, 5 μm to 10 μm.

The fixed portion 370 is a part that supports the movable portion 360, and is a part fixed to the substrate 1 or to the electronic component 2 when the movable portion 360 operates. In the present preferred embodiment, parts of the substrate 30 other than both the hollow portion 340 and the movable portion 360 serve as the fixed portion 370.

In the present preferred embodiment, the movable portion 360 and the fixed portion 370 are made of the same and single semiconductor that does not have a joined portion at a boundary therebetween. In the present preferred embodiment, the movable portion 360 and the fixed portion 370 (substrate 30) are made of Si.

The principal surface 310 has a concave portion 311. The concave portion 311 is positioned in a region that overlaps with the hollow portion 340 in the principal surface 310 when viewed in the z direction, and the concave portion 311 is gently concaved in the z direction.

In the present preferred embodiment, the hollow portion 340 has a side surface that stands up in the z direction and a bottom surface that spreads in directions (x direction and y direction) intersecting the z direction as shown in FIG. 8. The hollow portion 340 additionally has a curved surface by which the side surface and the bottom surface are joined together.

No limitations are imposed on the shape of the movable portion 360 and that of the hollow portion 340. For example, the movable portion 360 may be formed in a circular shape in a plan view. In this case, the hollow portion 340 becomes cylindrical.

The MEMS device 3 generates an electric signal according to the shape (distorted state) of the movable portion 360 that is deformed by a difference between the atmospheric pressure of the inside of the hollow portion 340 and the atmospheric pressure of the outside thereof, and outputs the electric signal to the electronic component 2.

As shown in FIG. 7 and FIG. 8, a diffusion resistor 37 is formed by the diffusion of impurities, and a diffusion wiring 36 is formed by the diffusion of impurities at the principal surface 310 of the substrate 30. The diffusion resistor 37 is formed at the principal surface 310 of the movable portion 360, and is a gauge resistor whose resistance value changes in accordance with the deformation of the movable portion 360. Additionally, a metal wiring 35 is formed by spattering at the principal surface 310 of the fixed portion 370, and an electrode pad 34 is formed at a predetermined position of the metal wiring 35. The diffusion resistor 37 and the diffusion wiring 36 are shown by the broken line in FIG. 7.

As shown in FIG. 7, four diffusion resistors 37a, 37b, 37c, and 37d are disposed in the movable portion 360 of the MEMS device 3. The four diffusion resistors 37a, 37b, 37c, and 37d are connected together by means of the metal wiring 35 and the diffusion wiring 36, and form a bridge circuit. Additionally, four electrode pads 34a, 34b, 34c, and 34d are disposed at the fixed portion 370 surrounding the movable portion 360 of the MEMS device 3.

The electrode pad 34a is connected to the metal wiring 35 by which the diffusion resistor 37a and the diffusion resistor 37c are connected together. The electrode pad 34b is connected to the metal wiring 35 by which the diffusion resistor 37a and the diffusion resistor 37b are connected together. The electrode pad 34c is connected to the metal wiring 35 by which the diffusion resistor 37c and the diffusion resistor 37d are connected together. The electrode pad 34d is connected to the metal wiring 35 by which the diffusion resistor 37b and the diffusion resistor 37d are connected together. A reference voltage of, for example, 5 V is applied between the electrode pad 34a and the electrode pad 34d, and a voltage between the electrode pad 34b and the electrode pad 34c is output to the electronic component 2 in the form of an electric signal. Because of the distortion of the movable portion 360, the diffusion resistor 37b and the diffusion resistor 37c extend in a direction (in a long-side longitudinal direction in FIG. 7) in which an electric current flows, and hence become large in resistance value. On the other hand, because of the distortion of the movable portion 360, the diffusion resistor 37a and the diffusion resistor 37d extend in a direction (in a short-side lateral direction in FIG. 7) perpendicular to a direction in which an electric current flows, and hence become small in resistance value. Consequently, the voltage between the electrode pad 34b and the electrode pad 34c changes in accordance with a distorted state of the movable portion 360. The wiring pattern of FIG. 7 is one example, and no limitations are imposed on the disposition positions and on the connecting method of the electrode pads 34a, 34b, 34c, and 34d, the diffusion resistors 37a, 37b, 37c, and 37d, the diffusion wiring 36, and the metal wiring 35.

As shown in FIG. 3 and FIG. 4, the MEMS device 3 is mounted closer to the x1 direction and the y1 direction of the mounting surface 2a of the electronic component 2. The MEMS device 3 and the electronic component 2 are joined together by means of a joint member, such as a silicone resin (not shown), etc. The electrode pad 34 (34a, 34b, 34c, 34d) of the MEMS device 3 is electrically joined to the electrode pad 11 of the substrate 1. The bonding wire 4 is bonded to the electrode pad 34. The electrode pad 34 is made of a metal, such as Al or an aluminum alloy, etc. Each electrode pad 34 is electrically connected to the electrode pad 21 of the electronic component 2 through the electrode pad 11 and the wiring pattern of the substrate 1. The electrode pad 34 of the MEMS device 3 and the electrode pad 21 of the electronic component 2 may be connected together by means of the bonding wire 4.

The bonding wire 4 is used to electrically connect the electrode pad 11 of the substrate 1 to the electrode pad 21 of the electronic component 2 or to the electrode pad 34 of the MEMS device 3, and is made of a metal, such as Au, etc. No limitations are imposed on the material of the bonding wire 4, and, for example, Al, Cu, or the like may be used as the material of the bonding wire 4. One end of the bonding wire 4 is bonded to the electrode pad 11, and the other end thereof is bonded to the electrode pad 21 or to the electrode pad 34.

The cover 6 is a metallic and box-shaped member, and is joined to the mounting surface 1a of the substrate 1 by means of the junction member 7 in such a manner as to surround the electronic component 2, the MEMS device 3, and the bonding wire 4. In the examples shown in the drawings, the cover 6 is rectangular in a plan view. The cover 6 may be made of a material other than the metal. No limitations are imposed on the method for manufacturing the cover 6. The space between the cover 6 and the substrate 1 is hollow without being filled with a resin.

As shown in FIG. 1 and FIG. 5, the cover 6 has an opening portion 61 and an extension portion 62. The opening portion 61 is used to take outside air into its inside. The opening portion 61 is provided, so that a hollow space is generated, and therefore the MEMS device 3 is capable of detecting air pressure (e.g., atmospheric pressure) around the MEMS module A1, and the temperature sensor of the electronic component 2 is capable of detecting temperature around the MEMS module A1. In the present preferred embodiment, only one opening portion 61 is disposed at a position closer to the z1 direction of the electrode pad 21 of the electronic component 2 (see FIG. 1). No limitations are imposed on the number of the opening portions 61. The extension portion 62 extends from an end edge of the opening portion 61, and overlaps with at least one part of the opening portion 61 in a plan view. The extension portion 62 is positioned so as to become closer to the z2 direction in proportion to an approach to its front end, and is tilted so as to become closer to the substrate 1 in proportion to an approach to its front end. In the arrangement shown in the drawings, the front end of the extension portion 62 is placed at a position that does not coincide with the position of the electronic component 2 and that does not coincide with the position of the MEMS device 3 in a plan view. The root of the extension portion 62 is placed at a position that coincides with the position of the electronic component 2 and that coincides with the position of the MEMS device 3.

Next, a method for manufacturing the MEMS device 3 will be hereinafter described with reference to FIG. 9 to FIG. 13.

First, a substrate material 300 is prepared as shown in FIG. 9. The substrate material 300 is a material used to form a substrate 30, and is, for example, a wafer from which a plurality of substrates 30 can be formed. In the drawings mentioned below, a region corresponding to a single substrate 30 of the substrate material 300 is shown. The thickness of the substrate material 300 is, for example, about 725 μm.

Figure 10:
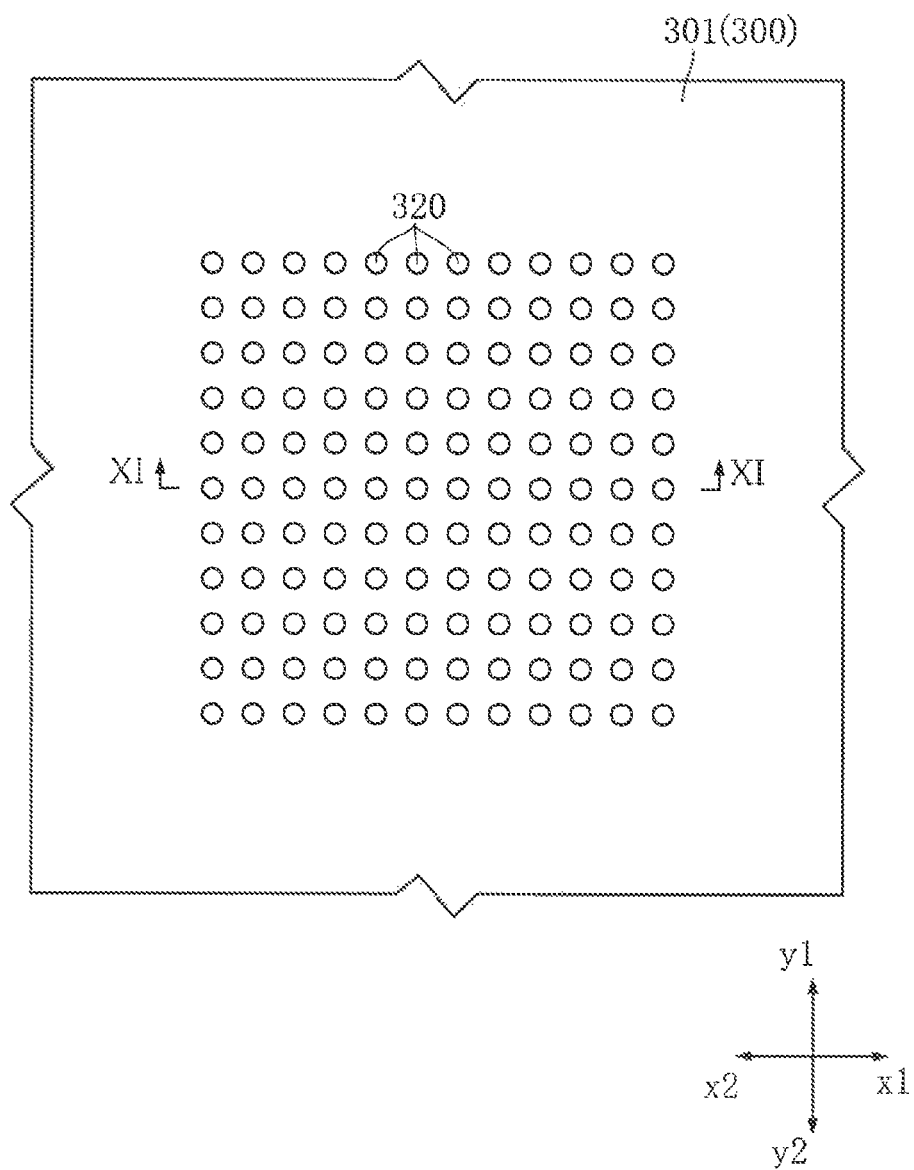
FIG. 10 is a plan view of a principal portion showing a method for manufacturing the MEMS device according to the first preferred embodiment of the present invention.

Thereafter, a hole forming step is performed. Deep etching, such as a Bosch process or the like is applied to a principal surface 310 of the substrate material 300. As a result, a plurality of holes 320 shown in FIG. 10 and FIG. 11 are formed. No specific limitations are imposed on the disposition of the plurality of holes 320, and, in the present preferred embodiment, the holes 320 are formed in a matrix manner in a rectangular region in a plan view as shown in FIG. 10. Additionally, in the present preferred embodiment, deep etching (Bosch process or the like) is performed so that the cross-sectional area that is at a right angle to the z direction of the holes 320 becomes larger in proportion to an approach to the innermost side in the z direction as shown in FIG. 11. As an example of the size, etc., of the plurality of holes 320, the diameter in the principal surface 310 of the hole 320 formed in a circular shape when viewed in the z direction is 0.2 μm to 0.8 μm, and the pitch between adjoining holes 320 (center-to-center distance) is 0.4 μm to 1.4 μm. Additionally, in the present preferred embodiment, the plurality of holes 320 are substantially equal in size to each other when viewed in the z direction.

Thereafter, a connecting-hollow-portion forming step is performed. In the present preferred embodiment, the connecting-hollow-portion forming step is performed by further continuing the deep etching operation (Bosch process or the like) that has been performed in the hole forming step. In other words, from the state of FIG. 11, the deep etching operation (Bosch process or the like) that further enlarges the cross-sectional area is continuously performed. When the diameter of the cross-sectional area becomes larger than the pitch (center-to-center distance) between adjoining holes 320 as shown in FIG. 12, bottom parts of the adjoining holes 320 are joined to each other. Consequently, a connecting hollow portion 330 by which the plurality of holes 320 are connected together is formed.

Thereafter, a movable-portion forming step is performed. In this step, the plurality of holes 320 are closed as shown in FIG. 13 by moving semiconductors of parts forming the plurality of holes 320 of the substrates 30. For example, a technique for producing a so-called thermomigration phenomenon in Si by heating the substrate 30 can be mentioned as a technique for moving the semiconductor (Si). In this technique, the substrate 30 is heated to, for example, 1100° C. to 1200° C. When the plurality of holes 320 are filled up by moving Si, the movable portion 360 is formed. Additionally, the connecting hollow portion 330 is sealed up, and is turned into the hollow portion 340. In this technique, a process of adding another material or a similar process is not performed to fill up the plurality of holes 320. Therefore, the size in the z direction of the movable portion 360 of FIG. 13 becomes smaller than the size in the z direction of the hole 320 of FIG. 12. Consequently, the concave portion 311 is formed at the principal surface 310.

Thereafter, the diffusion wiring 36, the diffusion resistor 37, the metal wiring 35, the electrode pad 34, etc., are formed, and the substrate material 300 is appropriately divided, thus obtaining the MEMS device 3 that has the substrate 30. The substrate 30 may be formed after reducing the thickness of the substrate material 300 by grinding the substrate material 300 from the side opposite to the principal surface 310.

Thereafter, the installation of the electronic component 2 onto the substrate 1, the installation of the MEMS device 3 onto the electronic component 2, the bonding of the bonding wire 4, the joining of the cover 6 to the substrate 1, and the like are performed, and, as a result, the MEMS module A1 is obtained.

Next, the manufacturing method of the MEMS device 3, the operation of the MEMS device 3, and the operation of the MEMS module A1 will be described.

According to the present preferred embodiment, the hole forming step of FIG. 11 and the connecting-hollow-portion forming step of FIG. 12 are performed, and then the movable-portion forming step is performed by closing the plurality of holes 320. Therefore, the step of joining a plurality of different members to each other is not required to form the movable portion 360 or the hollow portion 340. Therefore, advantageously, there is no fear of reducing sealability at a joined place. Additionally, advantageously, for example, such an excessively large hole as to pass through the substrate material 300 is not required to be provided to form the hollow portion 340.

In the movable-portion forming step, the plurality of holes 320 are closed by partially moving Si that is a semiconductor by use of thermomigration. Therefore, the thus formed movable portion 360 is a part made of only Si, and is arranged so as to be integrally joined to the fixed portion 370 likewise made of Si without using a joined portion. This is desirable to raise the sealability of the hollow portion 340. Additionally, the movable portion 360 made of only Si is suitable to form the diffusion resistor 37 or the diffusion wiring 36.

In the hole forming step, deep etching (Bosch process or the like) is performed so that the cross-sectional area that is at a right angle to the z direction gradually becomes larger. Thereafter, the connecting-hollow-portion forming step is performed by continuing the deep etching operation, and the connecting hollow portion 330 is formed. This makes it possible to perform the hole forming step and the connecting-hollow-portion forming step continuously by the same processing, which is desirable for the improvement of efficiency. Additionally, according to the deep etching operation, it is possible to form the hole 320 whose aspect ratio (ratio between the depth and the diameter) is remarkably large. In proportion to an increase in the aspect ratio, it becomes more advantageous to increase the thickness of the movable portion 360. If the movable portion 360 is thick, the relationship between the magnitude of atmospheric pressure and the amount of bending caused by atmospheric pressure becomes more linear, which is desirable as an atmospheric pressure sensor.

Figure 14:
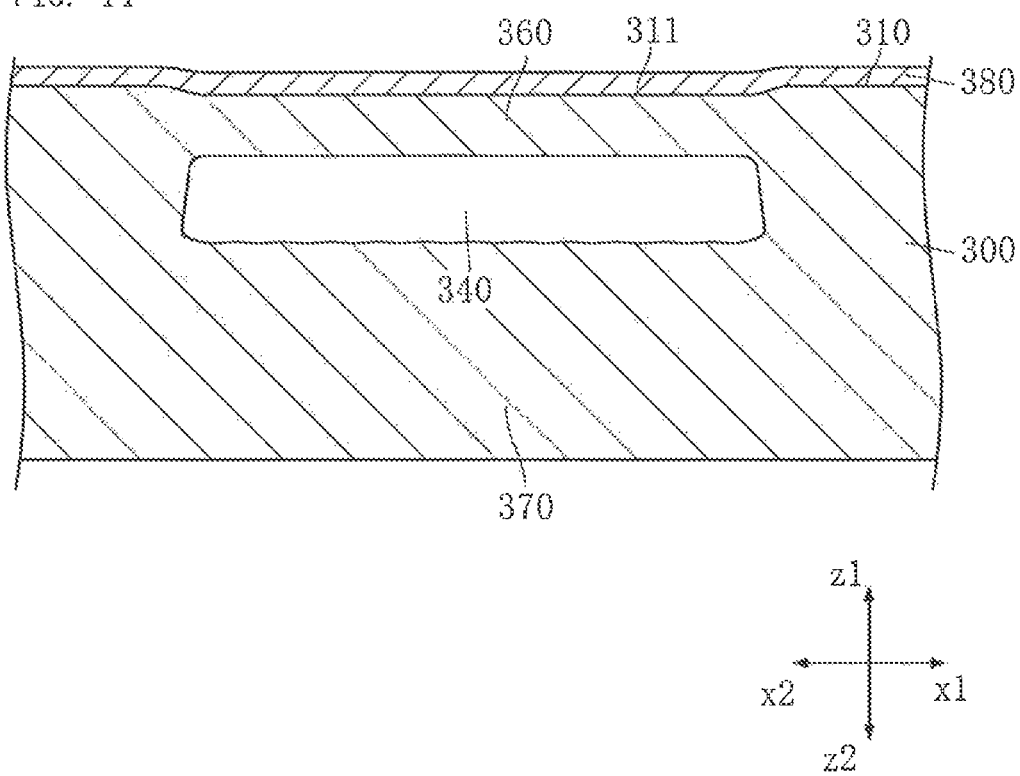
FIG. 14 is a cross-sectional view of the principal portion showing a modification of the method for manufacturing the MEMS device according to the first preferred embodiment of the present invention.

A technique for stacking an additional layer 380 on the principal surface 310 may be employed after the step shown in FIG. 13 as in a modification shown in FIG. 14. The additional layer 380 is a layer made of, for example, Si, and various techniques, such as EPI growth, etc., can be employed as a concrete technique for stacking the layer. This makes it possible to adjust the thickness of the movable portion 360. This modification can also be appropriately employed in the following preferred embodiments.

FIG. 15 to FIG. 31 show other preferred embodiments of the present invention. In these drawings, the same reference sign as in the aforementioned preferred embodiment is given to an element equivalent to or similar to that of the aforementioned preferred embodiment.

FIG. 15 to FIG. 20 show a method for manufacturing a MEMS device according to a second preferred embodiment of the present invention.

Figure 15:
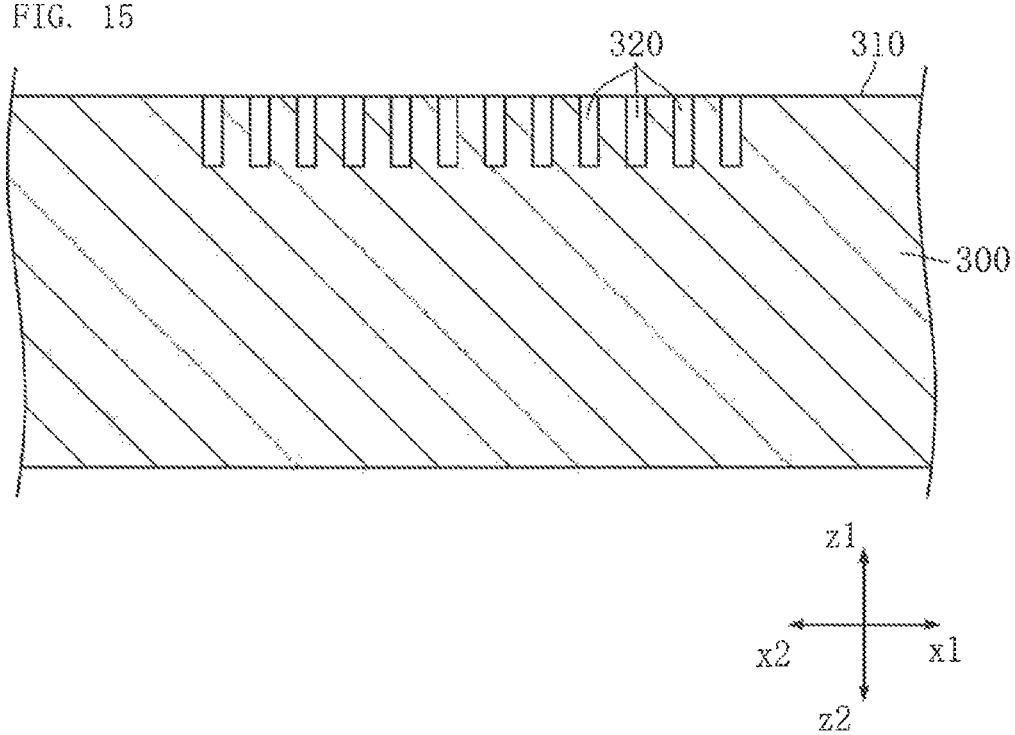

The substrate material 300 shown in FIG. 9 is prepared, and then the hole forming step is performed as shown in FIG. 15. In the present preferred embodiment, deep etching (Bosch process or the like) is performed so that the cross-sectional area that is at a right angle to the z direction of the plurality of holes 320 becomes constant.

Figure 16:
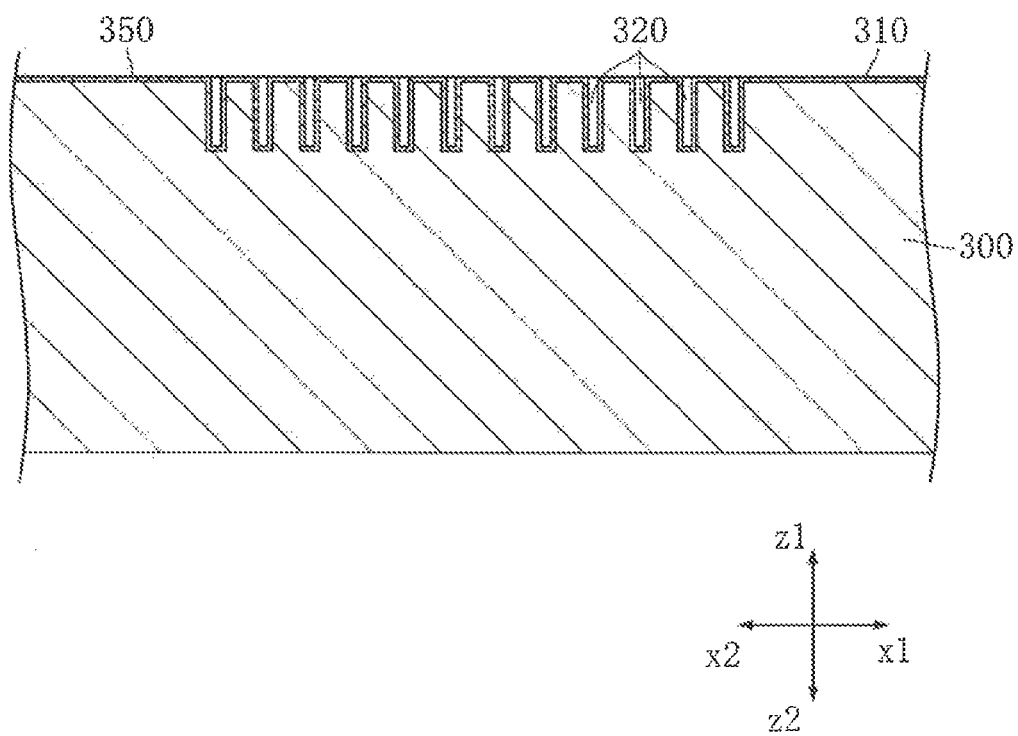

Thereafter, a protective-film forming step is performed as shown in FIG. 16. The principal surface 310 of the substrate material 300 and inner side surfaces and bottom surfaces of the holes 320 are covered with $SiO_2$ according to, for example, a CVD method or the like. Consequently, a protective film 350 made of $SiO_2$ is formed.

Thereafter, a through-hole forming step is performed as shown in FIG. 17. Only parts of the protective film 350 with which the bottom surfaces of the plurality of holes 320 are covered are removed by, for example, etching or the like. Consequently, a plurality of through-holes 351 are formed.

Thereafter, the connecting-hollow-portion forming step is performed as shown in FIG. 18. In the present preferred embodiment, an etching gas is allowed to act on an exposed part of the substrate material 300 through the plurality of through-holes 351 by employing, for example, an isotropic etching method. Consequently, the connecting hollow portion 330 is obtained. If the isotropic etching method is employed, an upper end in the z direction of the connecting hollow portion 330 is placed at a slightly more upward position than a lower end in the z direction of the protective film 350.

Thereafter, a protective-film removing step is performed as shown in FIG. 19. This step is performed, for example, by applying an etching operation by which $SiO_2$ can be selectively removed. Consequently, all of the protective film 350 made of $SiO_2$ is removed.

Figure 20:
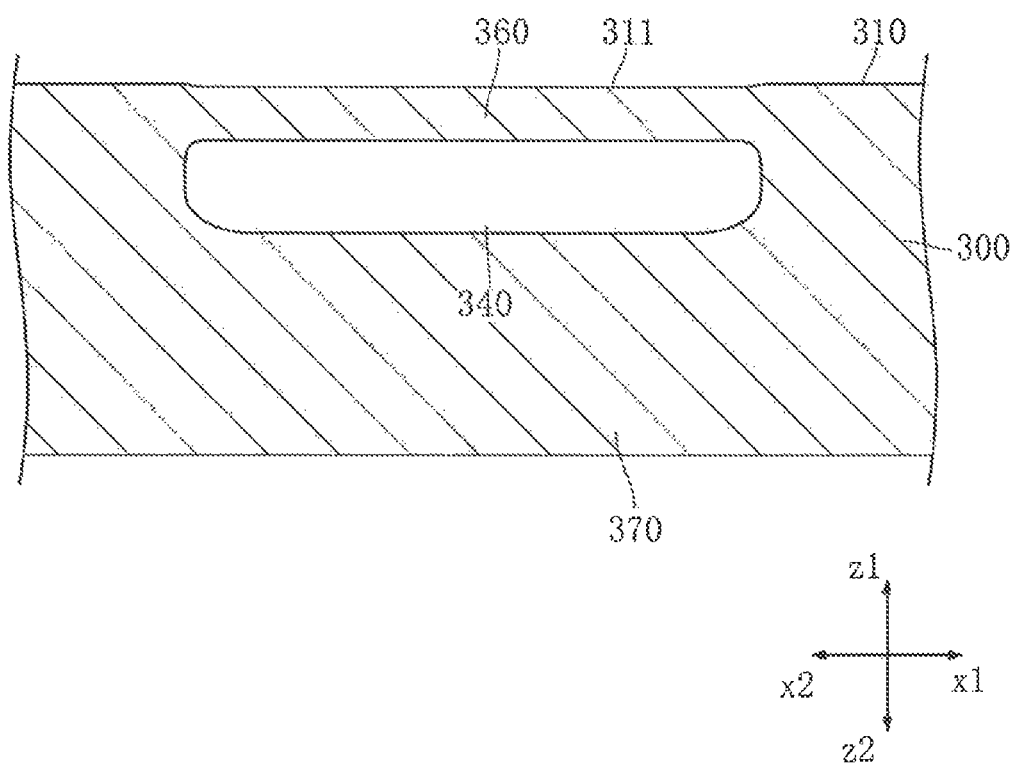

Thereafter, the movable-portion forming step is performed as shown in FIG. 20. This step is performed by a method using a thermomigration phenomenon in the same way as in the aforementioned preferred embodiment. Consequently, the hollow portion 340 and the movable portion 360 are obtained.

Thereafter, process steps are performed in the same way as in the aforementioned preferred embodiment, and, as a result, the MEMS device 3 is obtained, and the MEMS module A1 is additionally obtained.

Likewise, the present preferred embodiment has the advantage of the fact that there is no need to join different members together in order to form the hollow portion 340 and the movable portion 360. Additionally, the cross-sectional area of the plurality of holes 320 is constant, and therefore it is possible, for example, to make the cross-sectional area of the holes 320 smaller than in the aforementioned preferred embodiment. This is desirable for reliably sealing up the hollow portion 340. Additionally, it is possible to make the depth of the concave portion 311 that can be formed in the present preferred embodiment smaller than the depth of the concave portion 311 in the aforementioned preferred embodiment.

Figure 21:
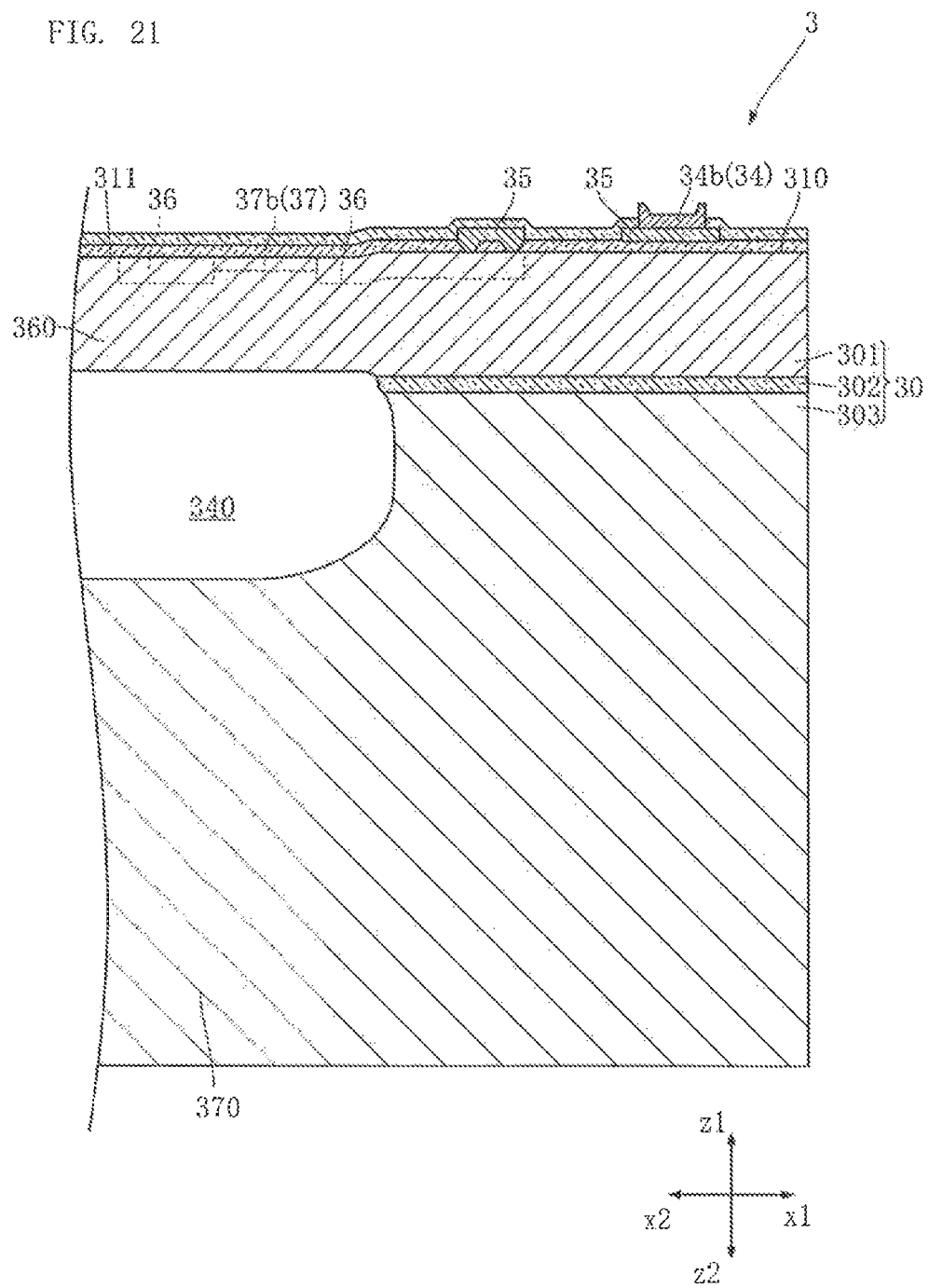
FIG. 21 is an enlarged cross-sectional view of a principal portion showing a MEMS device according to a third preferred embodiment of the present invention.

FIG. 21 shows a MEMS device 3 according to a third preferred embodiment of the present invention. In the present preferred embodiment, the substrate 30 consists of a first layer 301, a second layer 302, and a third layer 303. The first layer 301 is a layer made of Si, and is, for example, 5 µm to 10 µm in thickness. The second layer 302 is interposed between the first layer 301 and the third layer 303, and is a layer made of, for example, SiO$_2$. The second layer 302 is, for example, 0.5 μm to 1.5 μm in thickness. The third layer 303 is a layer made of Si in the same way as the first layer 301, and is, for example, 725 μm in thickness.

In the present preferred embodiment, the movable portion 360 is formed of the first layer 301. The fixed portion 370 is formed of apart of the first layer 301, the second layer 302, and the third layer 303. The hollow portion 340 is in an attitude in which a concave part of the third layer 303 is closed with the first layer 301.

FIG. 22 to FIG. 28 show a method for manufacturing the MEMS device 3 in the present preferred embodiment.

Figure 22:
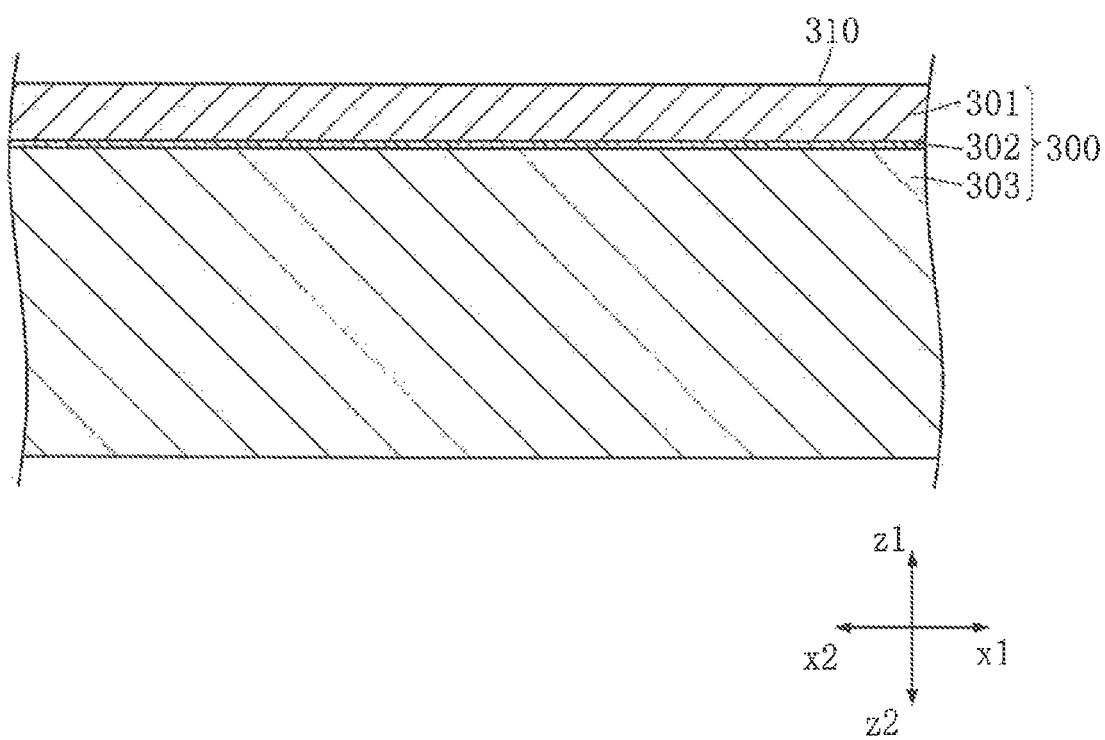

First, the substrate material 300 shown in FIG. 22 is prepared. The substrate material 300 is formed of the first layer 301, the second layer 302, and the third layer 303 mentioned above.

Figure 23:
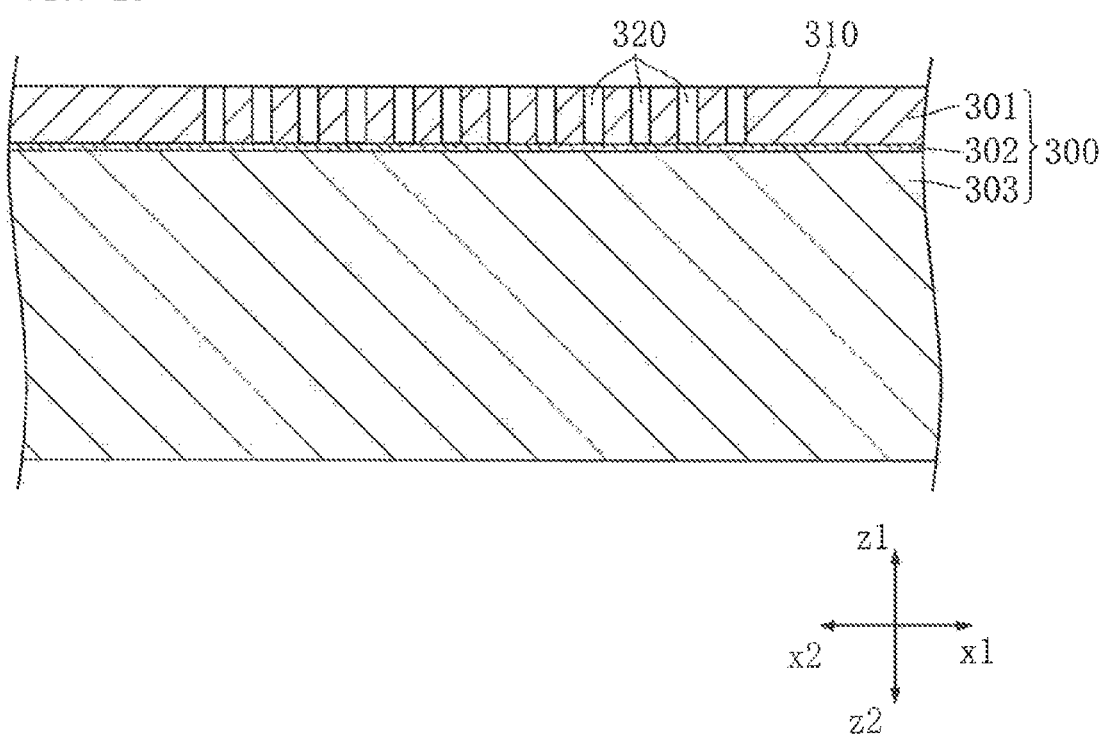

Thereafter, the hole forming step is performed as shown in FIG. 23. In the present preferred embodiment, a plurality of holes 320 are formed in the first layer 301 by means of deep etching (Bosch process or the like). The holes 320 of the present preferred embodiment pass through the first layer 301, and yet do not pass through the second layer 302. Therefore, the inner side surface of the hole 320 is formed of the first layer 301, and the bottom surface of the hole 320 is formed of the second layer 302.

Figure 24:
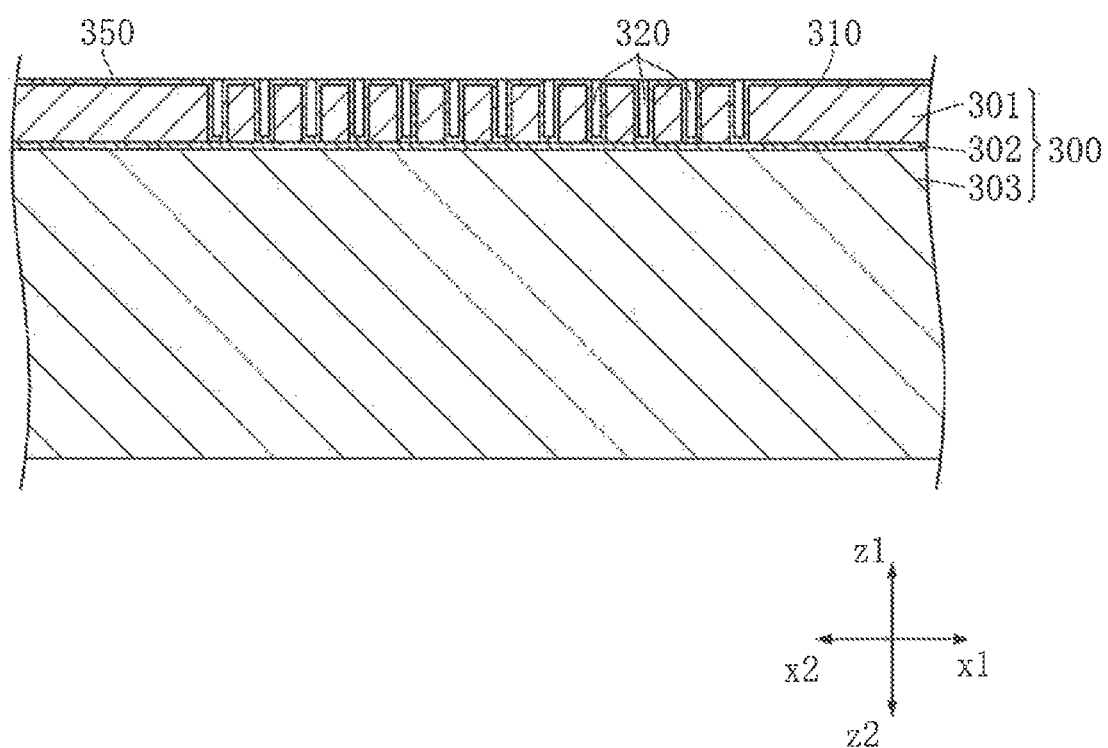

Thereafter, the protective-film forming step is performed as shown in FIG. 24. In this step, the principal surface 310 of the first layer 301 and the inner side surfaces and bottom surfaces of the plurality of holes 320 are covered with SiO$_2$ according to the CVD method or the like. Consequently, the protective film 350 made of SiO$_2$ is formed.

Figure 25:
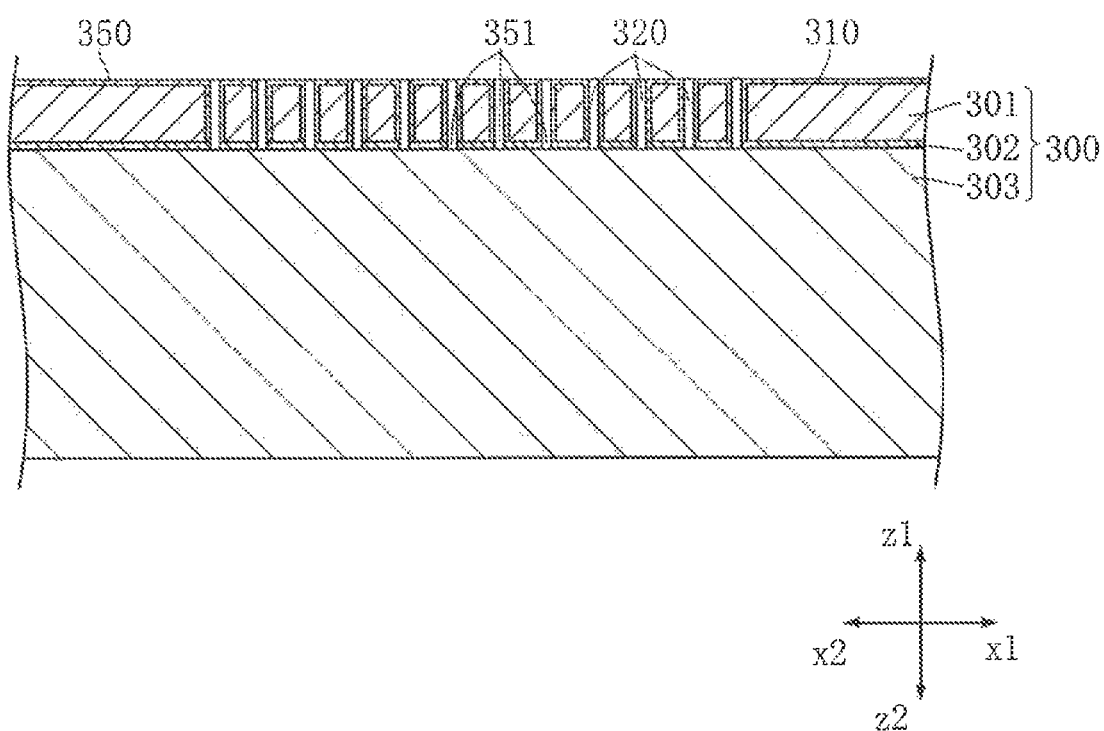

Thereafter, the through-hole forming step is performed as shown in FIG. 25. Only parts of the protective film 350 with which the bottom surfaces of the plurality of holes 320 are covered and only parts of the second layer 302 that form the bottom surfaces of the holes 320 are removed by, for example, etching or the like. Consequently, a plurality of through-holes 351 are formed.

Figure 26:
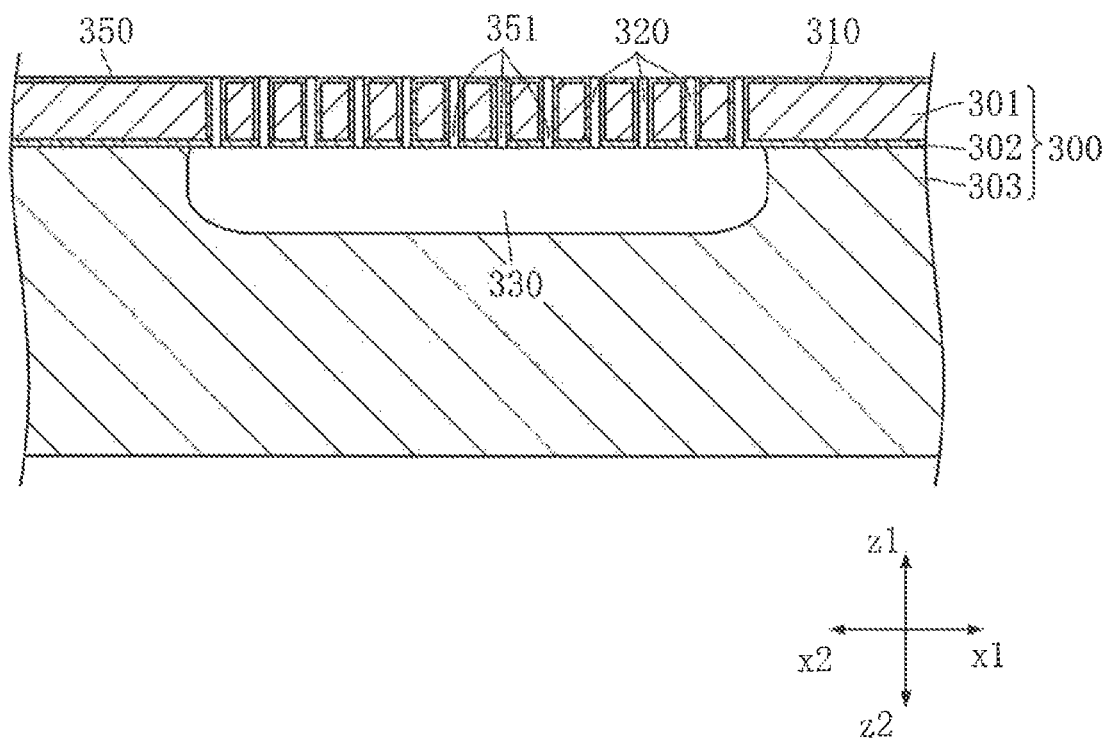

Thereafter, the connecting-hollow-portion forming step is performed as shown in FIG. 26. In the present preferred embodiment, an etching gas is allowed to act on an exposed part of the substrate material 300 through the plurality of through-holes 351 by employing, for example, the isotropic etching method. Consequently, the connecting hollow portion 330 is obtained. In the present preferred embodiment, the first layer 301 in a region other than that of the plurality of through-holes 351 is covered with the second layer 302. Therefore, the upper end in the z direction of the connecting hollow portion 330 is defined by a lower surface of the second layer 302.

Thereafter, the protective-film removing step is performed as shown in FIG. 27. This step is performed, for example, by applying an etching operation by which SiO$_2$ can be selectively removed. Consequently, all of the protective film 350 made of SiO$_2$ is removed. Additionally, parts of the second layer 302 that are exposed from the first layer 301 and the third layer 303 are removed.

Figure 28:
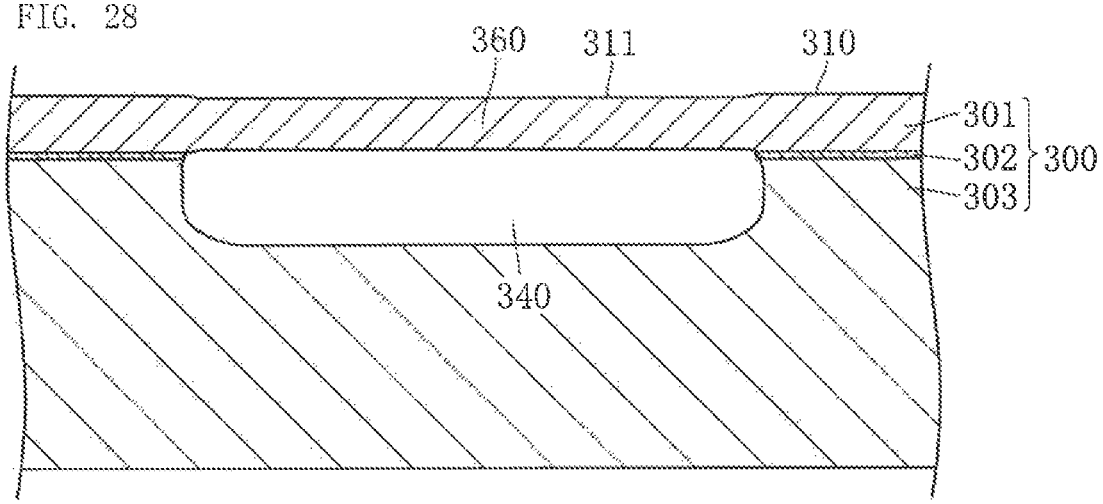

Thereafter, the movable-portion forming step is performed as shown in FIG. 28. This step is performed by a method using a thermomigration phenomenon in the same way as in the aforementioned preferred embodiment. Consequently, the hollow portion 340 and the movable portion 360 are obtained.

Thereafter, process steps are performed in the same way as in the aforementioned preferred embodiment, and, as a result, the MEMS device 3 is obtained, and the MEMS module A1 is additionally obtained.

Likewise, the present preferred embodiment has the advantage of the fact that there is no need to join different members together in order to form the hollow portion 340 and the movable portion 360. Additionally, in the hole forming step and the connecting-hollow-portion forming step, the second layer 302 functions as an etching stopper layer. This makes it possible to more accurately set the depth of the hole 320 and the depth of the connecting hollow portion 330 (the hollow portion 340).

Figure 29:
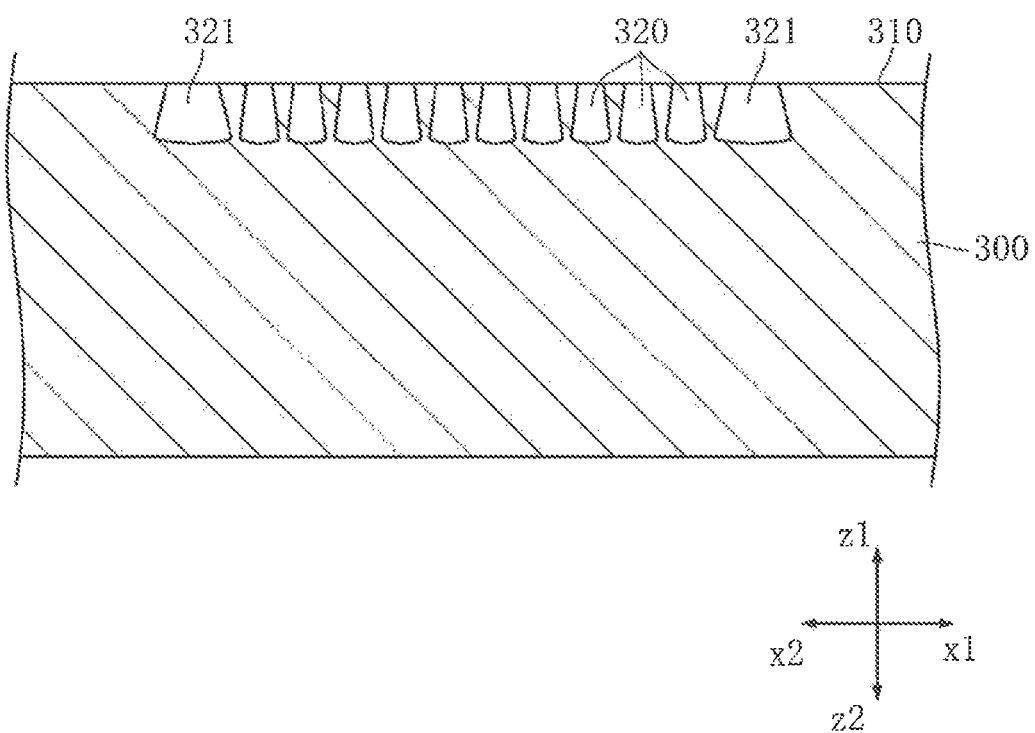
FIG. 29 is an enlarged cross-sectional view of a principal portion showing a MEMS device according to a fourth preferred embodiment of the present invention.
Figure 30:
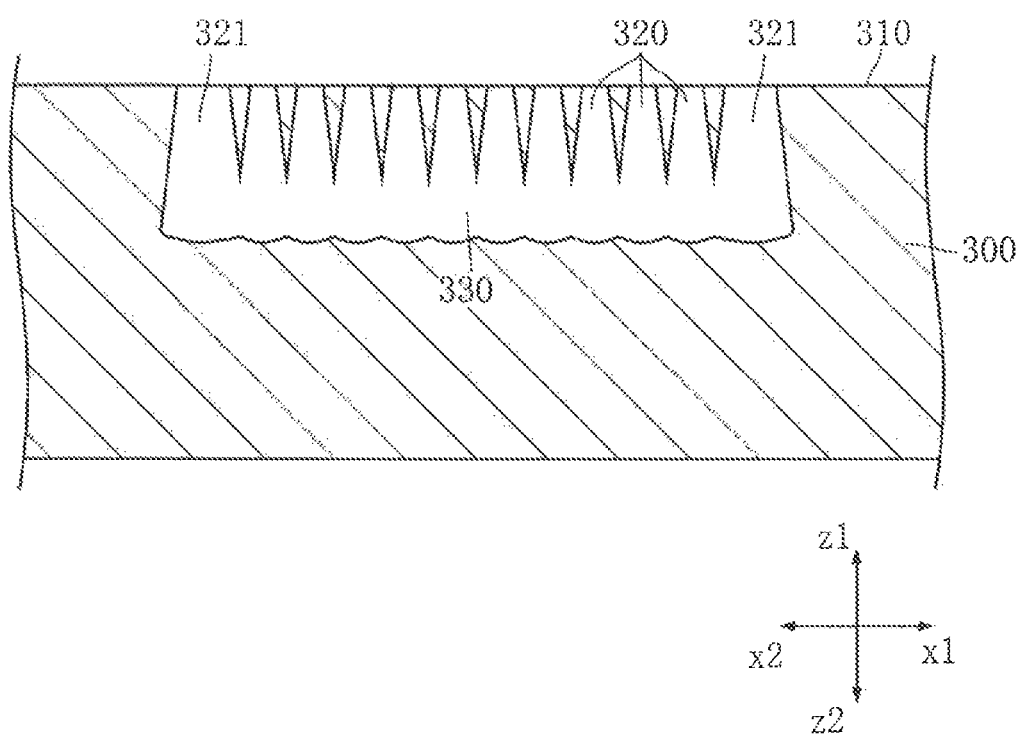

FIG. 29 to FIG. 31 show a method for manufacturing a MEMS device according to a fourth preferred embodiment of the present invention. Although the method employed in the present preferred embodiment is similar to the aforementioned manufacturing method employed in the first preferred embodiment, a method similar to that of the second preferred embodiment or similar to that of the third preferred embodiment may be employed in the present preferred embodiment.

FIG. 29 shows the hole forming step in the present preferred embodiment. In the present preferred embodiment, a plurality of holes 321 are formed in addition to the plurality of holes 320. The cross-sectional area (diameter if it has a circular shape when viewed in the z direction) of the hole 321 is larger than that (diameter if it has a circular shape when viewed in the z direction) of the hole 320.

FIG. 30 shows the connecting-hollow-portion forming step. Through this step, the plurality of holes 320 and the plurality of holes 321 are connected together by means of the connecting hollow portion 330.

FIG. 31 shows the movable-portion forming step of the present preferred embodiment. Likewise, in the present preferred embodiment, the plurality of holes 320 are closed by the method by use of thermomigration. However, the plurality of holes 321 remain without being closed by thermomigration because the cross-sectional area (diameter) of the hole 321 is larger than that (diameter) of the hole 320. Therefore, the hollow portion 340 is joined to the outside through the holes 321 in the present preferred embodiment.

Likewise, the present preferred embodiment has the advantage of the fact that there is no need to join different members together. Additionally, it is possible to use the MEMS device 3 formed according to the present preferred embodiment as one of various sensor devices functioning by allowing the movable portion 360 to be moved by external force, inertia force, etc.

Figure 32:
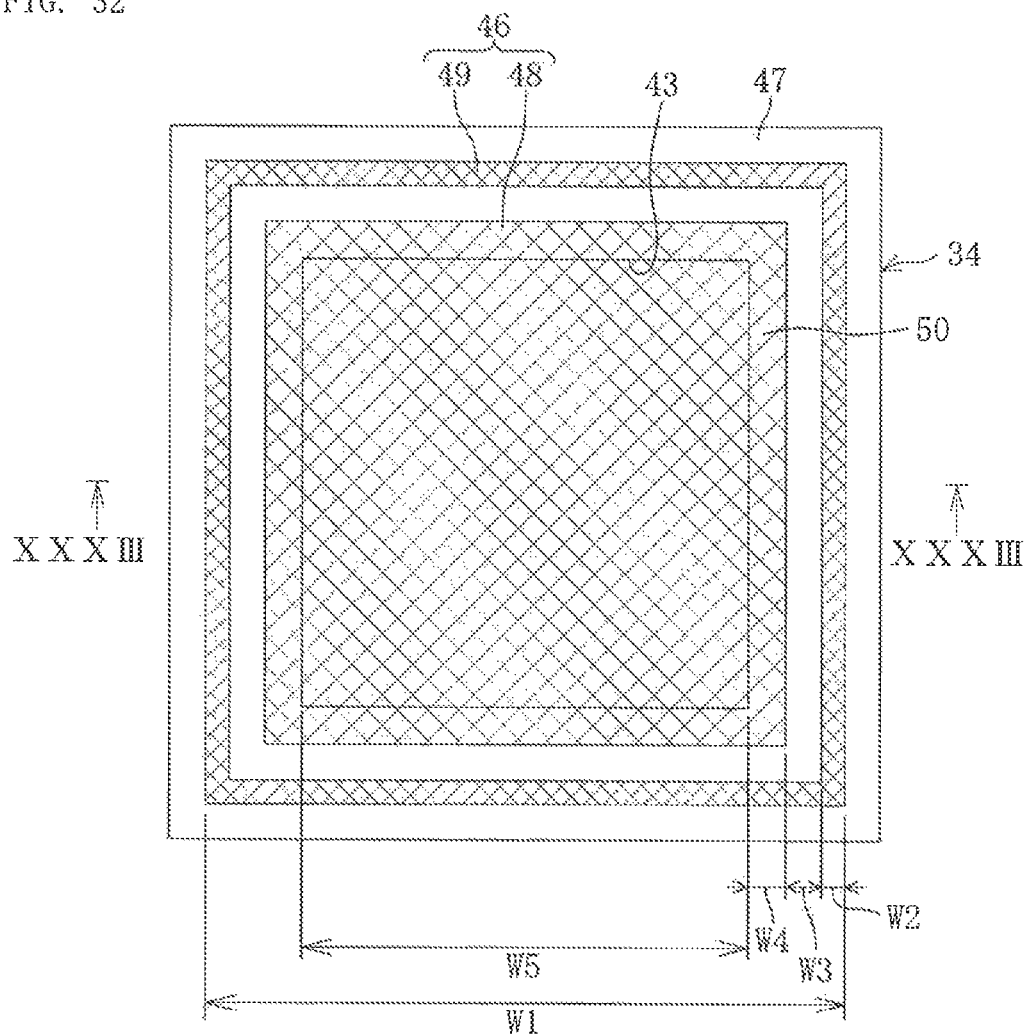
FIG. 32 is a plan view of a principal portion of an electrode pad shown to describe a structure (a first mode) of the electrode pad.
Figure 33:
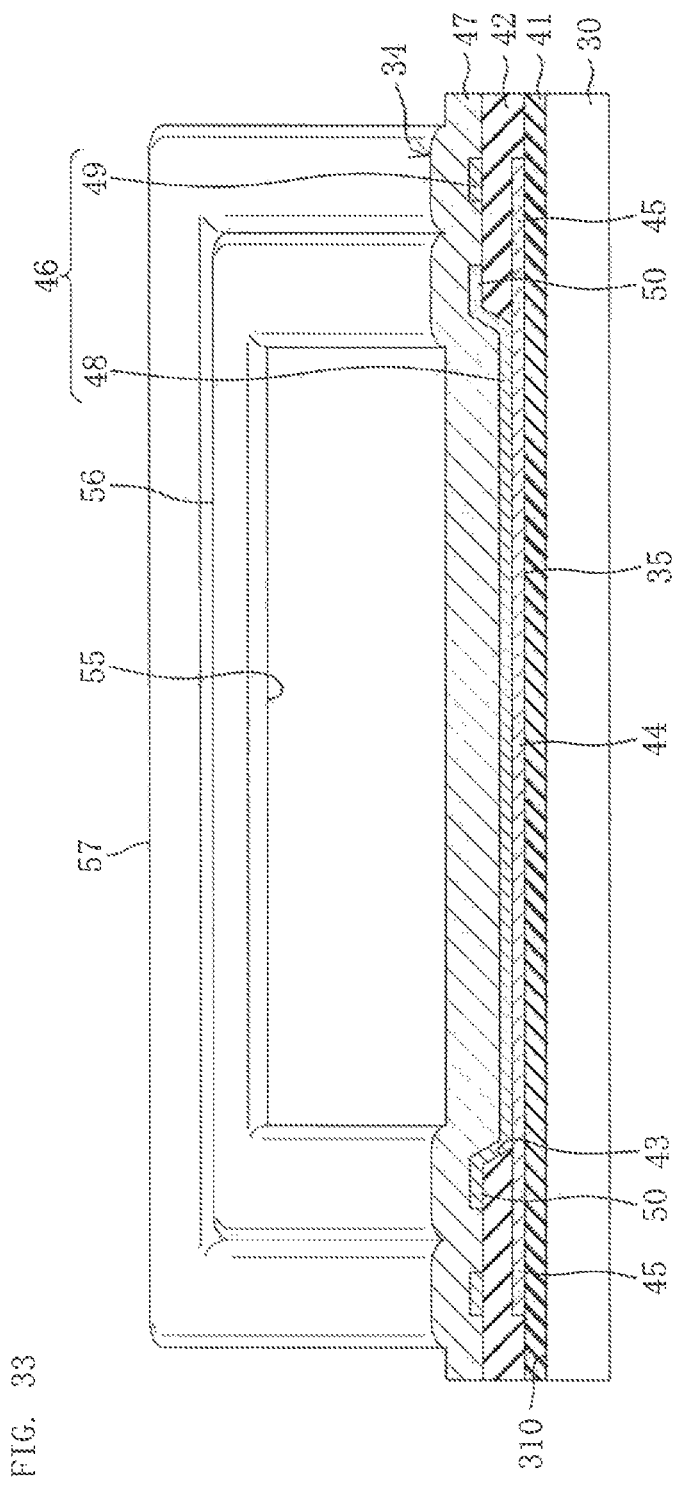
FIG. 33 is a cross-sectional view taken along line XXXIII-XXXIII of FIG. 32.
Figure 34:
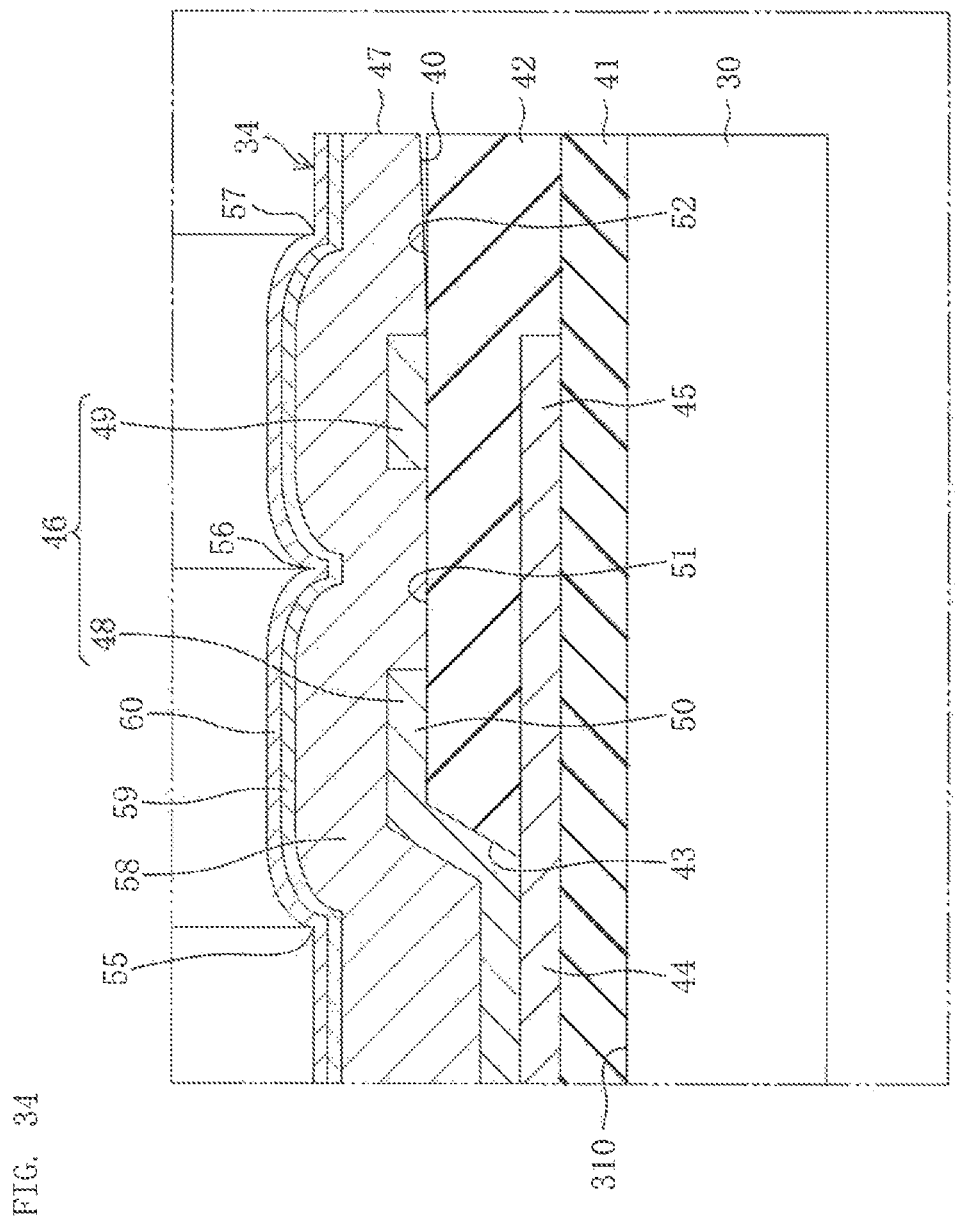
FIG. 34 is a cross-sectional view of a principal portion showing an outer peripheral portion of the electrode pad.

FIG. 32 is a plan view of a principal portion of the electrode pad 34 shown to describe a structure (a first mode) of the electrode pad 34. FIG. 33 is a cross-sectional view showing a cross section taken along line XXXIII-XXXIII of FIG. 32, in which the electrode pad 34 is viewed from obliquely above. FIG. 34 is a cross-sectional view of a principal portion showing an outer peripheral portion of the electrode pad 34. In FIG. 32, a pad portion 48 and an outer peripheral portion 49 of a first metallic layer 46 are cross-hatched to make the structure clear.

Next, a description will be given in more detail of a structure of the electrode pad 34 and that of its peripheral portion shown in FIG. 8 with reference to FIG. 32 to FIG. 37E.

Referring to FIG. 32 to FIG. 34, a first insulating layer 41 is formed on the substrate 30. In the present preferred embodiment, the first insulating layer 41 is formed so as to come into contact with the principal surface 310 of the substrate 30. The first insulating layer 41 may be made of an insulating material, such as silicon oxide (SiO$_2$) or silicon nitride (SiN), etc. In the present preferred embodiment, the first insulating layer 41 is made of a silicon oxide. The thickness of the first insulating layer 41 may be, for example, 1000 Å to 5000 Å.

A metal wiring 35 is formed on the first insulating layer 41. The metal wiring 35 may be formed on the first insulating layer 41 with a predetermined pattern. The metal wiring 35 may be made of a metal, such as Al or an aluminum alloy, etc.

A second insulating layer 42 is formed on the first insulating layer 41 so as to cover the metal wiring 35. The second insulating layer 42 may be made of an insulating material, such as silicon oxide ($SiO_2$) or silicon nitride (SiN), etc. In the present preferred embodiment, the second insulating layer 42 is made of silicon nitride. The thickness of the second insulating layer 42 maybe larger than that of the first insulating layer 41, and may be, for example, 5000 Å to 20000 Å. Additionally, the second insulating layer 42 is an insulating film exposed to the topmost surface of the MEMS device 3 in the present preferred embodiment, and therefore may be called a surface insulating film.

A contact hole 43 is formed in the second insulating layer 42. A part of the metal wiring 35 is exposed from the contact hole 43. The exposed part of the metal wiring 35 may be called an exposed portion 44, and other parts that do not include the exposed portion 44 of the metal wiring 35 and that are covered with the second insulating layer 42 may be called a coated portion 45.

The electrode pad 34 is formed on the second insulating layer 42. The electrode pad 34 includes the first metallic layer 46 and a second metallic layer 47 formed so as to cover the first metallic layer 46.

The first metallic layer 46 may be made of a metal, such as Al, an aluminum alloy (e.g., AlSi, AlSiCu, AlCu, etc.), or Cu, etc.

The first metallic layer 46 includes the pad portion 48 and the outer peripheral portion 49 that surrounds the pad portion 48.

The pad portion 48 is formed on the contact hole 43, and is connected to the metal wiring 35 (exposed portion 44) inside the contact hole 43. Additionally, the pad portion 48 has a part 50 that protrudes outwardly from the contact hole 43 and that is disposed on the second insulating layer 42. Referring to FIG. 32, the part 50 is a flange-shaped part that evenly protrudes from a peripheral edge of the contact hole 43 in the present preferred embodiment.

The outer peripheral portion 49 is formed independently of (i.e., physically separated from) the pad portion 48 at a position with an interval outwardly from the part 50 of the pad portions 48. It should be noted that the outer peripheral portion 49 is electrically connected to the pad portion 48 through the second metallic layer 47.

In the present preferred embodiment, the outer peripheral portion 49 is formed in an annular shape (more specifically, quadrangular annular shape) that surrounds the pad portion 48 as shown in FIG. 32, and yet the outer peripheral portion 49 may partially have regions in which it has been divided if it surrounds the pad portion 48 so that it can fulfill the effect of preventing the pad portion 48 from being corroded (described later).

Additionally, referring to FIG. 33 and FIG. 34, the outer peripheral portion 49 may face the coated portion 45 of the metal wiring 35 with the second insulating layer 42 therebetween.

Here, the size of the pad portion 48 and the size of the outer peripheral portion 49 will be described. First, the outer diameter W1 of the outer peripheral portion 49 may be, for example, about 90 μm. The width W2 of the outer peripheral portion 49 may be, for example, about 8 μm. The interval W3 between the outer peripheral portion 49 and the pad portion 48 (for example, distance between the inner periphery of the outer peripheral portion 49 and the outer periphery of the pad portion 48) may be smaller than the width W2, and may be, for example, about 2 μm. The width W4 of the part 50 of the pad portion 48 (i.e., amount of protrusion from the contact hole 43) may be, for example, about 5 μm. The diameter W5 of the contact hole 43 (width of a connection region between the pad portion 48 and the metal wiring 35) may be, for example, about 60 μm.

The second metallic layer 47 is formed so as to cover the pad portion 48 and the outer peripheral portion 49 of the first metallic layer 46 together. As a result, the second metallic layer 47 has a part 53 that enters a region 51 between the pad portion 48 and the outer peripheral portion 49 and that covers the outer peripheral edge of the pad portion 48 and the inner peripheral edge of the outer peripheral portion 49 and a part 54 that is disposed in a region 52 outside the outer peripheral portion 49 and that covers the outer peripheral edge of the outer peripheral portion 49. The part 53 and the part 54 of the second metallic layer 47 are both in contact with the second insulating layer 42 in the region 51 and in the region 52.

The second metallic layer 47 additionally has a plurality of concave portions at its part according to a stepped difference formed in a structure below the second metallic layer 47. In the present preferred embodiment, the second metallic layer 47 has a concave portion 55 according to a difference in height of the contact hole 43, a concave portion 56 according to a difference in height between the second insulating layer 42 and the first metallic layer 46 in the region 51, and a concave portion 57 according to a difference in height between the second insulating layer 42 and the first metallic layer 46 in the region 52.

Referring to FIG. 33, the concave portion 55 is formed at a central part of the electrode pad 34, and the concave portion 56 is formed in an annular shape (in the present preferred embodiment, a quadrangular annular shape) that surrounds the concave portion 55, and the concave portion 57 is formed in an annular shape (in the present preferred embodiment, a quadrangular annular shape) that further surrounds the concave portion 56.

In the present preferred embodiment, the second metallic layer 47 may be formed by plating growth as described later. In this case, the second metallic layer 47 may be called, for example, a plated layer, and, referring to FIG. 34, may have a Ni layer 58, a Pd layer 59, and an Au layer 60 in order from the first-metallic-layer-46 side. For example, the thickness of the Ni layer 58 may be about 3 μm, and the thickness of the Pd layer 59 may be about 0.1 μm, and the thickness of the Au layer 60 may be about 0.03 μm. Of course, the second metallic layer 47 is not necessarily required to be formed by plating growth, and may be formed by a film forming technique, such as a sputtering method or the like. A technique for forming a corrosion-resisting metal, such as Au, etc., according to the sputtering method can be mentioned as an example.

FIG. 35A to FIG. 35F are drawings shown to describe process steps relative to the formation of the electrode pad 34. The steps shown in FIG. 35A to FIG. 35F may be performed, for example, after the step of FIG. 13 mentioned above and after the formation of the diffusion wiring 36 and the formation of the diffusion resistor 37.

For example, first, the first insulating layer 41 is formed on the principal surface 310 of the substrate material 300 as shown in FIG. 35A. The first insulating layer 41 may be formed, for example, by the thermal oxidation of the semiconductor crystal surface or by the CVD method.

Thereafter, the metal wiring 35 is formed on the first insulating layer 41 as shown in FIG. 35B. The metal wiring 35 may be formed, for example, by forming a metal film on the first insulating layer 41 according to the sputtering method and then by performing a patterning operation.

Thereafter, the second insulating layer 42 is formed on the first insulating layer 41 so as to cover the metal wiring 35 as shown in FIG. 35C. The second insulating layer 42 may be formed by, for example, the CVD method.

Figure 35D:
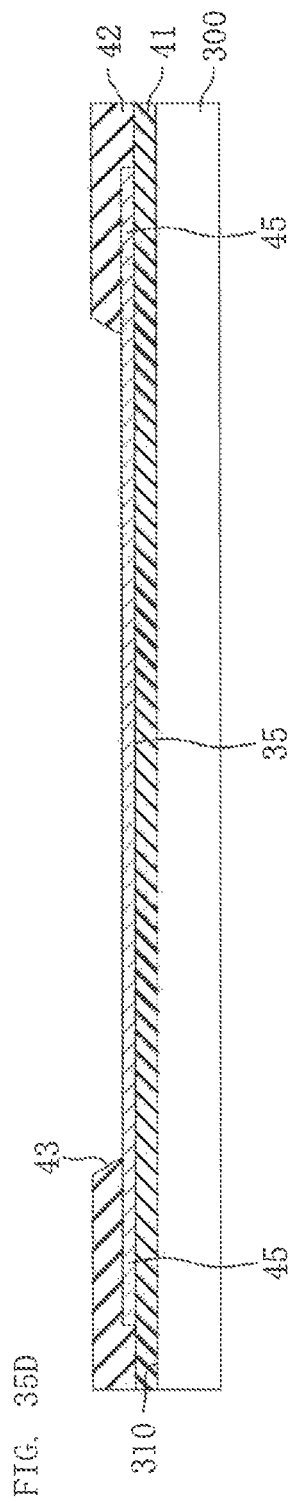

Thereafter, the contact hole 43 is formed in the second insulating layer 42 as shown in FIG. 35D. The contact hole 43 may be formed by etching, such as dry etching or the like.

Thereafter, the first metallic layer 46 is formed on the second insulating layer 42 as shown in FIG. 35E. The first metallic layer 46 may be formed by forming a metal film on the second insulating layer 42 and on the metal wiring 35 inside the contact hole 43 according to, for example, the sputtering method and then by performing a patterning operation. The first metallic layer 46 may be divided by the patterning operation into the pad portion 48 and the outer peripheral portion 49.

Thereafter, the second metallic layer 47 is formed on the second insulating layer 42 so as to cover the first metallic layer 46 as shown in FIG. 35F. Consequently, the electrode pad 34 shown in FIG. 32 to FIG. 34 is formed. The second metallic layer 47 maybe formed by, for example, plating growth from the first metallic layer 46 (for example, electroless plating).

Referring here to FIG. 34, there is a case in which a gap 40 is generated between the second metallic layer 47 (in the present preferred embodiment, plated layer) and the second insulating layer 42 in the outer periphery of the electrode pad 34. One of the factors by which the gap 40 is generated is, for example, the fact that the second metallic layer 47 is formed by plating growth. The second metallic layer 47 (in the present preferred embodiment, Ni layer 58) is subjected to plating growth in the thickness direction of the second insulating layer 42 (in the longitudinal direction, i.e., in the present preferred embodiment, in the upward direction) and in a direction (lateral direction) perpendicular to the thickness direction as described above while using the pad portion 48 and the outer peripheral portion 49 of the first metallic layer 46 as nucleuses, respectively. In the lateral direction, plating merely progresses along the surface of the second insulating layer 42, and therefore a joint is not formed between the second metallic layer 47 and the second insulating layer 42. Therefore, from the viewpoint of a mechanism, warpage or the like occurs in the Ni layer 58, and the gap 40 is generated, for example, if stress (interlaminar stress or the like) is applied onto the Ni layer 58 after the Pd layer 59 and the Au layer 60 are formed on the Ni layer 58.

On the other hand, the first metallic layer 46 and the second metallic layer 47 are joined together by means of these metals, and therefore no gap is generated. Therefore, in the region 51, an interface exists between the second metallic layer 47 and the second insulating layer 42, and yet the second metallic layer 47 in the region 51 is supported by metal-metal joining generated on both sides, i.e., on the inside and the outside of the region 51 (joining between the second metallic layer 47 and the pad portion 48 and joining between the second metallic layer 47 and the outer peripheral portion 49), and therefore it is also possible to prevent a gap from being generated in the interface.

If the gap 40 mentioned above is formed at the outer peripheral portion of the second metallic layer 47, there is a fear that moisture or salinity (for example, salt water) will enter into the electrode pad 34 through the gap 40. The problem of the intrusion of moisture or the like becomes obvious particularly in products used while being exposed to outside air, such as pressure sensors, humidity sensors, and devices in which these sensors are integrated, etc., in addition to the MEMS device 3 (atmospheric pressure sensor). However, if the structure of the electrode pad 34 of the present preferred embodiment is employed, the outer peripheral portion 49 physically separated from the pad portion 48 is disposed around the pad portion 48 of the first metallic layer 46 connected directly to the metal wiring 35 that is an internal electric wiring of the MEMS device 3.

Therefore, it is possible to block moisture or salinity (for example, salt water) by means of the outer peripheral portion 49 functioning as a guard ring even if the gap 40 is generated between the second metallic layer 47 and the second insulating layer 42 and even if such moisture or salinity enters into the electrode pad 34 through the gap 40. In other words, even if the outer peripheral portion 49 is corroded by such moisture or the like, it is possible to prevent the corrosion from being propagated to the pad portion 48 because the outer peripheral portion 49 and the pad portion 48 are physically separated from each other. As a result, it is possible to defend the pad portion 48 joined to the internal electric wiring against moisture or salinity.

Figure 36:
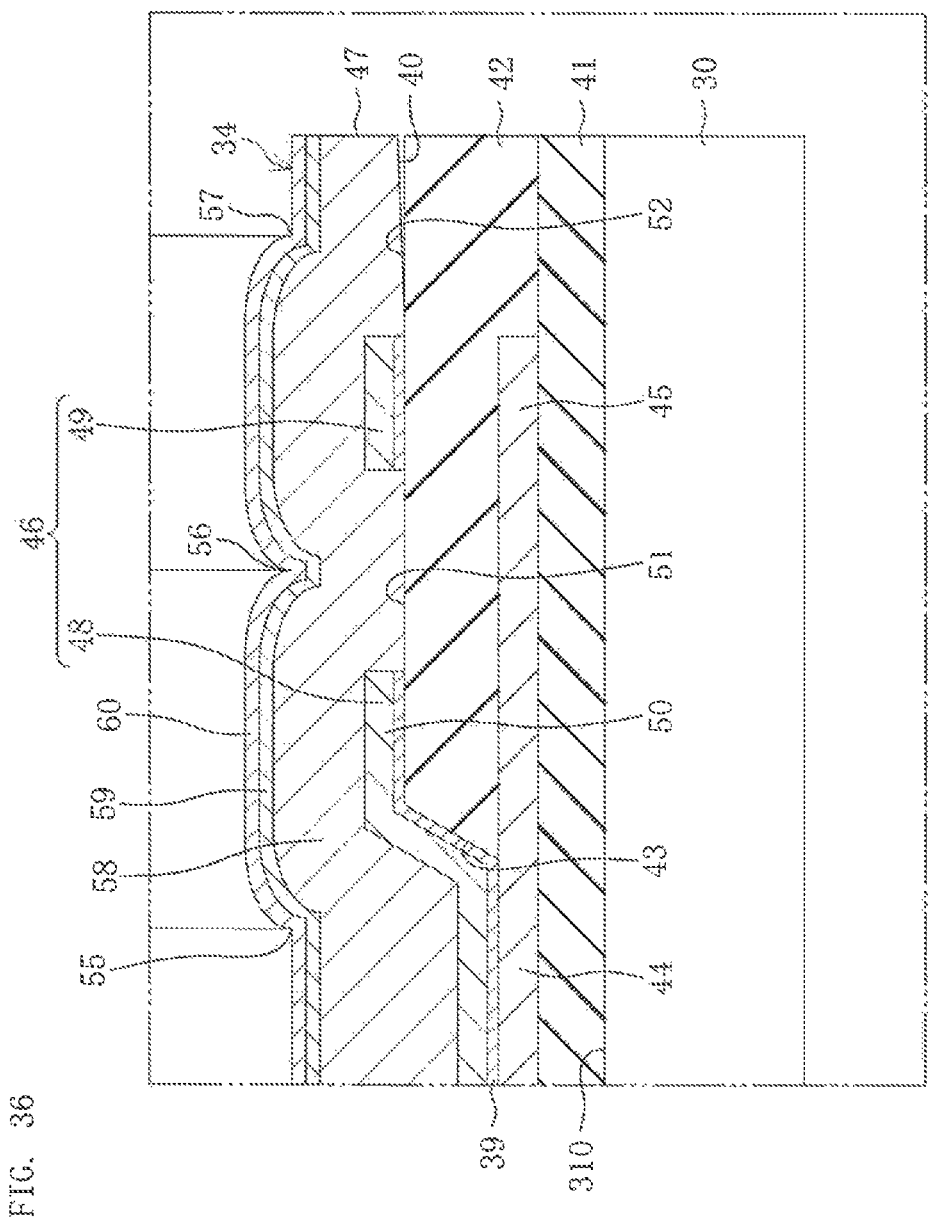
FIG. 36 is a cross-sectional view of a principal portion of an electrode pad shown to describe a structure (a second mode) of the electrode pad.

Referring to FIG. 36, a barrier layer 39 made of, for example, Ti, etc., maybe formed between the first metallic layer 46 and the second insulating layer 42. For example, the barrier layer 39 may be formed by forming a material film for the barrier layer 39 according to, for example, the sputtering method prior to the formation of the first metallic layer 46 in the step of FIG. 35E and then by being subjected to patterning in the same patterning step as the first metallic layer 46. Additionally, it is also possible to apply the structure of the electrode pad 34 described above to various electrode pads provided in semiconductor devices other than the MEMS device.

Figure 37:
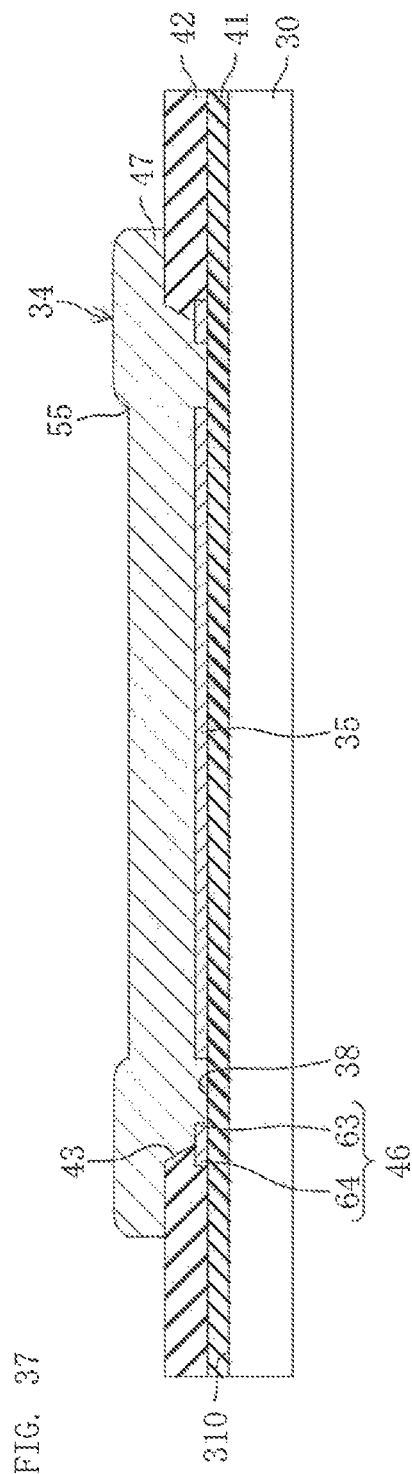
FIG. 37 is a cross-sectional view of a principal portion of an electrode pad shown to describe a structure (a third mode) of the electrode pad.

FIG. 37 is a cross-sectional view of a principal portion of the electrode pad 34 shown to describe a structure (a third mode) of the electrode pad 34.

In this third mode, the metal wiring 35 is formed in an inner region of the contact hole 43 of the second insulating layer 42 inwardly from the inner surface of the contact hole 43 with an interval between the metal wiring 35 and the inner surface of the contact hole 43. Consequently, a region 38 formed of a part of the first insulating layer 41 is exposed between the metal wiring 35 and the inner surface of the contact hole 43.

The first metallic layer 46 is formed in the region 38 of the first insulating layer 41 so as to surround the metal wiring 35. In the present preferred embodiment, the first metallic layer 46 is formed so as to straddle between the inside and the outside of the contact hole 43, and integrally has a first part 63 that extends toward the inner region of the contact hole 43 and a second part 64 that extends toward an outer region of the contact hole 43 and that is covered with the second insulating layer 42.

The second metallic layer 47 is formed so as to cover the first metallic layer 46 and the metal wiring 35 together. Consequently, the second metallic layer 47 is connected to the first metallic layer 46 and to the metal wiring 35 inside the contact hole 43.

Likewise, in this structure, it is possible to block moisture or salinity (for example, salt water) by means of the first metallic layer 46 functioning as a guard ring even if such moisture or salinity enters into the electrode pad 34 through the gap 40 (see FIG. 34) between the second metallic layer 47 and the second insulating layer 42. In other words, even if the first metallic layer 46 is corroded by such moisture or the like, it is possible to prevent the corrosion from being propagated to the metal wiring 35 because the first metallic layer 46 and the metal wiring 35 are physically separated from each other. As a result, it is possible to defend the metal wiring 35 against moisture or salinity.

FIG. 38A to FIG. 38E are drawings shown to describe a process relative to the formation of the electrode pad 34 of FIG. 37. Steps shown in FIG. 38A to FIG. 38E may be performed, for example, after the step of FIG. 13 mentioned above and after the formation of the diffusion wiring 36 and the formation of the diffusion resistor 37.

Figure 38A:
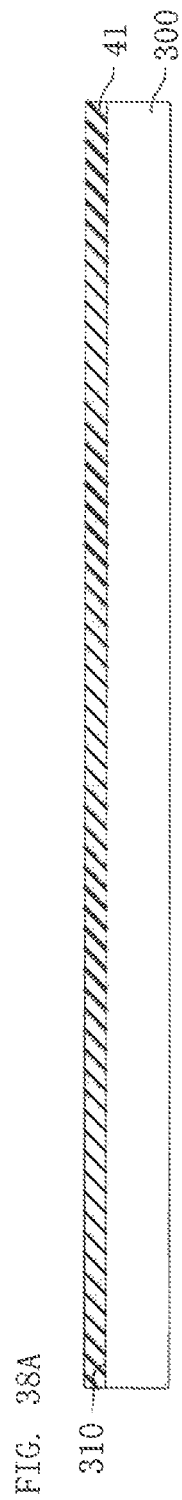

For example, first, the first insulating layer 41 is formed on the principal surface 310 of the substrate material 300 as shown in FIG. 38A. The first insulating layer 41 may be formed, for example, by the thermal oxidation of the semiconductor crystal surface or by the CVD method.

Figure 38B:
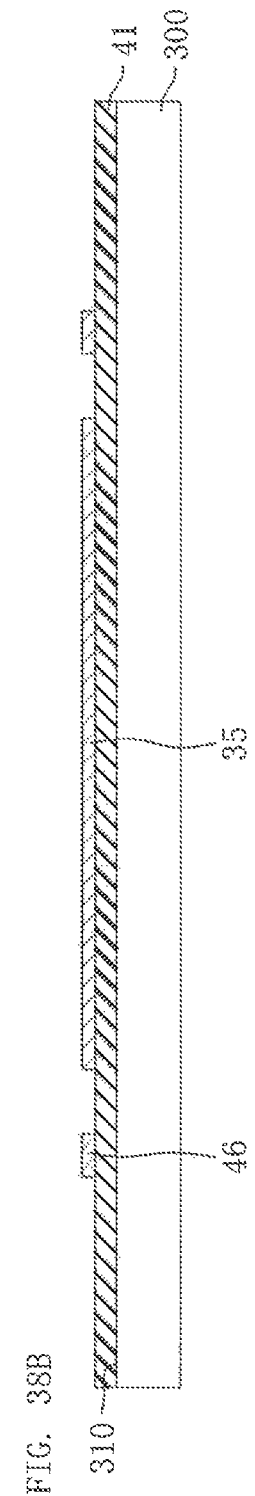

Thereafter, the metal wiring 35 and the first metallic layer 46 are formed on the first insulating layer 41 as shown in FIG. 38B. The metal wiring 35 and the first metallic layer 46 may be formed, for example, by forming a metal film on the first insulating layer 41 according to the sputtering method and then by performing a patterning operation.

Figure 38C:
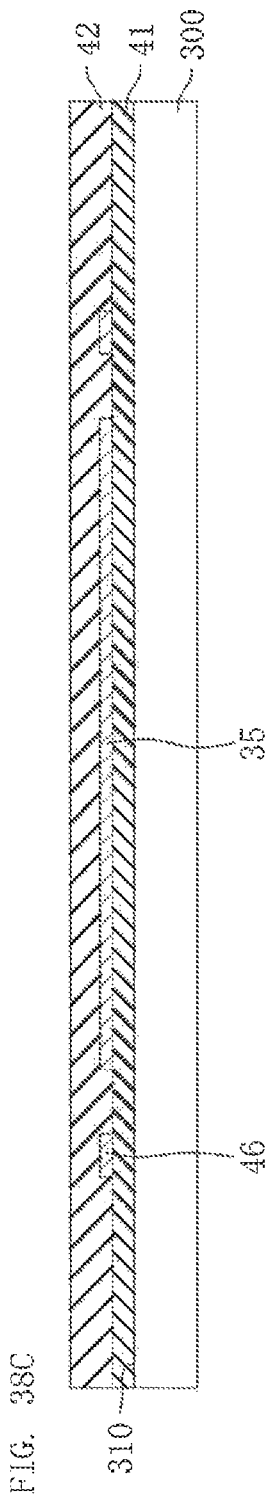

Thereafter, the second insulating layer 42 is formed on the first insulating layer 41 so as to cover the metal wiring 35 and the first metallic layer 46 as shown in FIG. 38C. The second insulating layer 42 may be formed by, for example, the CVD method.

Figure 38D:
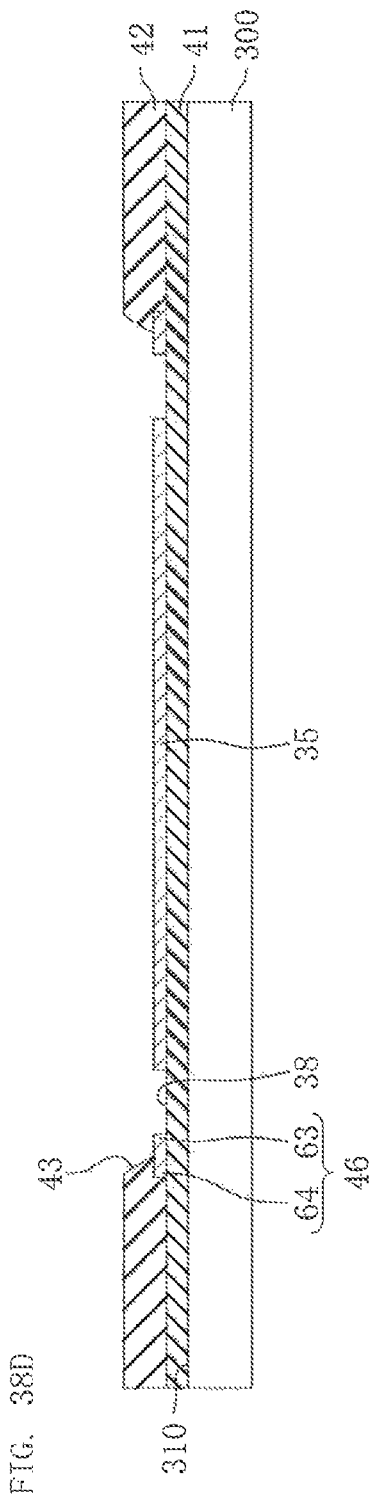

Thereafter, the contact hole 43 is formed in the second insulating layer 42 as shown in FIG. 38D. The contact hole 43 may be formed by etching, such as dry etching or the like.

Thereafter, the second metallic layer 47 is formed on the second insulating layer 42 so as to cover the metal wiring 35 and the first metallic layer 46 as shown in FIG. 38E. Consequently, the electrode pad 34 shown in FIG. 37 is formed.

The MEMS-device manufacturing method, the MEMS device, and the MEMS module according to the present invention are not limited to those of the aforementioned preferred embodiments. Concrete configurations of the MEMS-device manufacturing method, the MEMS device, and the MEMS module according to the present invention can be designed or changed variously and freely.

What is claimed is:

1. A MEMS device characterized in that the MEMS device includes:
   a substrate that has a movable portion and a hollow portion both of which coincide with each other when viewed in a thickness direction and a fixed portion that supports the movable portion, and characterized in that the movable portion and the fixed portion are made of a same and single semiconductor that does not have a joined portion at a boundary between the movable portion and the fixed portion;
   a first metallic layer formed on the substrate, the first metallic layer having a pad portion, and an outer peripheral portion that is physically separated from the pad portion and that surrounds the pad portion; and
   a second metallic layer covering the pad portion and the outer peripheral portion together, and having a portion that enters a first region between the pad portion and the outer peripheral portion, wherein
   the substrate has a principal surface including a surface of the movable portion, and the principal surface has a concave portion that coincides with the movable portion when viewed in the thickness direction, and
   the outer peripheral portion is electrically connected to the pad portion through the second metallic layer.

2. The MEMS device according to claim 1, wherein the semiconductor is Si.

3. The MEMS device according to claim 1, wherein the hollow portion has a side surface that stands up in the thickness direction, a bottom surface that spreads in a direction that intersects the side surface, and a curved surface that joins the side surface and the bottom surface together.

4. The MEMS device according to claim 1, wherein the hollow portion is sealed up.

5. A MEMS module characterized by comprising:
   the MEMS device of claim 1; and
   an electronic component that processes an electric signal emitted from the MEMS device.

6. The MEMS device according to claim 1, including
   a metal wiring formed on the substrate; and
   an insulating layer formed on the metal wiring, the insulating layer having a contact hole from which a part of the metal wiring is exposed, wherein
   the pad portion is formed on the contact hole, and is connected to the metal wiring inside the contact hole.

7. The MEMS device according to claim 6, wherein the outer peripheral portion faces a part of the metal wiring covered with the insulating layer such that the insulating layer is disposed between the outer peripheral portion and the part of the metal wiring.

8. The MEMS device according to claim 1, including
   a metal wiring formed on the substrate; and
   an insulating layer formed on the metal wiring, the insulating layer having a contact hole from which a part of the metal wiring is exposed, wherein
   the pad portion is formed on the contact hole, and is connected to the metal wiring inside the contact hole,
   the outer peripheral portion is formed on the insulating layer, and
   the second metallic layer has a first concave portion according to a difference in height of the contact hole, and a second concave portion according to a difference in height between the insulating layer and the first metallic layer in the first region.

9. The MEMS device according to claim 1, wherein the hollow portion has a cross-sectional area that is at a right angle to a thickness direction of the substrate and becomes larger in proportion to an approach to an innermost side in the thickness direction.

* * * * *